US011411661B2

(12) United States Patent
Li et al.

(10) Patent No.: US 11,411,661 B2
(45) Date of Patent: Aug. 9, 2022

(54) CALIBRATION CIRCUITS FOR BEAM-FORMING ANTENNAS AND RELATED BASE STATION ANTENNAS

(71) Applicant: CommScope Technologies LLC, Hickory, NC (US)

(72) Inventors: Hong Hui Li, Suzhou (CN); Martin Zimmerman, Chicago, IL (US); Bo Wu, Suzhou (CN); Ligang Wu, Suzhou (CN)

(73) Assignee: CommScope Technologies LLC, Hickory, NC (US)

( * ) Notice: Subject to any disclaimer, the term of this patent is extended or adjusted under 35 U.S.C. 154(b) by 98 days.

(21) Appl. No.: 17/036,265

(22) Filed: Sep. 29, 2020

(65) Prior Publication Data

US 2021/0028871 A1    Jan. 28, 2021

Related U.S. Application Data

(62) Division of application No. 16/394,094, filed on Apr. 25, 2019, now Pat. No. 10,812,200.

(30) Foreign Application Priority Data

Apr. 27, 2018  (CN) .......................... 201810388669.0
Jun. 19, 2018  (CN) .......................... 201810628269.2

(51) Int. Cl.
  *H04B 17/12* (2015.01)
  *H04B 7/06* (2006.01)
  *H04B 7/08* (2006.01)
(52) U.S. Cl.
  CPC .......... *H04B 17/12* (2015.01); *H04B 7/0617* (2013.01); *H04B 7/086* (2013.01)

(58) Field of Classification Search
  CPC ...... H04B 17/12; H04B 7/0617; H04B 7/086; H01Q 3/267; G01R 29/10
  See application file for complete search history.

(56) References Cited

U.S. PATENT DOCUMENTS 9,300,408 B2    3/2016  Katipally et al.
2003/0227420 A1*  12/2003  Roper .................... H01Q 3/267
                                                343/797

FOREIGN PATENT DOCUMENTS

CN      105356052      5/2014
CN      103825104      2/2016
(Continued)

OTHER PUBLICATIONS

"International Search Report and Written Opinion", International Application No. PCT/US19/028847, dated Sep. 18, 2019.

*Primary Examiner* — Yuwen Pan
*Assistant Examiner* — Angelica M Perez
(74) *Attorney, Agent, or Firm* — Myers Bigel, P.A.

(57) ABSTRACT

A base station antenna includes a backplane and a plurality of radiating elements that extend forwardly from the backplane. The antenna further includes a plurality of feed boards, and each of the feed boards has a respective group of one or more of the radiating elements mounted thereon. The antenna also includes a calibration port and a calibration circuit that has a calibration combiner that has an output that is coupled to the calibration port and a plurality of directional couplers that are coupled to the calibration combiner. At least a first portion of a first of the first directional couplers is implemented on a first of the feed boards.

17 Claims, 9 Drawing Sheets

(56) References Cited

FOREIGN PATENT DOCUMENTS

CN 106099394 11/2016
EP 3214700 * 9/2017

* cited by examiner

CALIBRATION CIRCUITS FOR BEAM-FORMING ANTENNAS AND RELATED BASE STATION ANTENNAS

CROSS-REFERENCE TO RELATED APPLICATIONS

The present application claims priority under 35 U.S.C. § 120 as a divisional of U.S. patent application Ser. No. 16/394,094, filed Apr. 25, 2020, which in turn claims priority to Chinese Patent Application No. 201810628269.2, filed Jun. 19, 2018, and to Chinese Patent Application No. 201810388669.0, filed Apr. 27, 2018, the entire content of each of which are incorporated herein by reference as if set forth in their entireties.

FIELD

The present invention relates to cellular communications systems and, more particularly, to cellular communications systems that employ beam-forming antennas.

BACKGROUND

Cellular communications systems are used to provide wireless communications to fixed and mobile subscribers (herein "users"). In a typical cellular communications system, a geographic area is divided into a series of regions that are referred to as "cells," and each cell is served by a base station. Each base station may include baseband equipment, radios and base station antennas that are configured to provide two-way radio frequency ("RF") communications with users that within the cell. The base station antennas are often mounted on a tower or other raised structure.

Base station antennas are directional devices that can concentrate the RF energy that is transmitted or received in certain directions. The "gain" of a base station antenna in a given direction is a measure of the ability of the antenna to concentrate the RF energy in that direction. The radiation pattern that is generated by a base station antenna, which is also referred to as the "antenna beam," is compilation of the gain of the antenna across all different directions. The radiation pattern of a base station antenna is typically designed to service a pre-defined coverage area such as the cell or a portion thereof that is typically referred to as a "sector." A base station antenna is typically designed to have minimum gain levels throughout its pre-defined coverage area, and to have much lower gain levels outside of the coverage area to reduce interference with adjacent cells or sectors. Typically, a base station antenna includes one or more phase-controlled arrays of radiating elements, with the radiating elements arranged in one or more vertical columns when the antenna is mounted for use, where "vertical" refers to a direction that is generally perpendicular relative to the plane defined by the horizon.

FIG. 1 is a schematic diagram of a conventional cellular base station 10. The base station 10 includes several base station antennas 20 that are mounted on a raised structure 30 such as an antenna tower. Baseband equipment 40 may be mounted at the base of the tower 30 and cabling connections 42 may connect the baseband equipment 40 to remote radio heads (not visible in FIG. 1) that are mounted behind each base station antenna 20. Each base station antenna 20 may generate an antenna beam 50 (shown schematically in FIG. 1) that provides service to a 120° "sector" in the horizontal or "azimuth" plane. For example, each base station antenna 20 may be designed to have a half power beamwidth of about 65° which provides good coverage throughout the 120° sector.

Early base station antennas typically had a fixed radiation pattern, meaning that once a base station antenna was installed, its radiation pattern could not be changed unless a technician physically reconfigured the antenna. Today, the radiation patterns on many base station antennas can be changed electronically from a remote location by transmitting control signals to the antenna that alter the amplitude and/or phase of the of the RF energy that is transmitted/received through each radiating element of the array, which changes the shape of the radiation pattern. The most common changes to the radiation pattern are changes in the elevation or "down tilt" angle (i.e., the angle relative to the horizon at which the portion of the antenna beam that has the highest gain points) and/or azimuth angle (the angle in the horizontal plane at which the portion of the antenna beam that has the highest gain points). Base station antennas that can have their down tilt and/or azimuth angle changed electronically from a remote location are typically referred to as remote electronic tilt ("RET") antennas.

In order to increase capacity, some cellular base stations now employ beam-forming radios and multi-column beam-forming antennas. In some beam-forming antennas, each column of radiating elements is coupled to a respective RF port of a radio. The radio may adjust the amplitude and phase of the sub-components of an RF signal that are passed to each RF port so that the columns of radiating elements work together to form a more focused, higher gain antenna beam that has a narrowed beamwidth in the azimuth and/or elevation planes. In some cases, these beam-forming antennas may be used to form two or more static antenna beams, where each antenna beam has a smaller beamwidth in the azimuth plane. This approach may be used to perform so-called "sector splitting" where a 120° sector can be split into two, three or even more smaller sub-sectors, and the beam-forming antenna may be configured to generate a separate antenna beam for each sub-sector. Beam-forming antennas are also available that are capable of forming narrow antenna beams that are sometimes referred to as "pencil beams" that can be pointed at specific users or closely clustered groups of users. These antennas can generate different pencil beams on a time-slot by time-slot basis so that very high gain antenna beams can be electronically steered throughout a sector during different time-slots to provide coverage to the users throughout the sector.

Unfortunately, the relative amplitude and phases applied by the radio to the sub-components of the RF signal that are passed to each column of a beam-forming antenna may not be maintained as the sub-components of the RF signal are passed from the radio, to a high power amplifier, and then on to the base station antenna. If the relative amplitudes and phases change, then the resulting antenna beam will typically exhibit lower antenna gains in desired directions and higher antenna gains in undesired directions, resulting in degraded performance. Variations in the relative amplitudes and phases may arise, for example, because of non-linearities in the amplifiers that are used to amplify the respective transmitted and received signals, differences in the lengths of the cabling connections between the different radio ports and respective RF ports on the antenna, variations in temperature and the like. While some of the causes for the amplitude and phase variations may tend to be static (i.e., they do not change over time), others may be dynamic, and hence more difficult to compensate.

In order to reduce the impact of the above-discussed amplitude and phase variations, beam-forming antennas may include a calibration circuit that samples each sub-component of an RF signal and passes these samples back to the radio. The calibration circuit may comprise a plurality of directional couplers, each of which is configured to tap RF energy from a respective one of the RF transmission paths that extend between the RF ports and the respective columns of radiating elements, as well as a calibration combiner that is used to combine the RF energy tapped off of each of these RF transmission paths. The output of the calibration combiner is coupled to a calibration port on the antenna, which in turn is coupled back to the radio. The radio may use the samples of each sub-component of the RF signal to determine the relative amplitude and/or phase variations along each transmission path, and may then adjust the applied amplitude and phase weights to account for these variations.

SUMMARY

Pursuant to some embodiments of the present invention, base station antennas are provided that include a backplane and a plurality of radiating elements that extend forwardly from the backplane. The antenna further includes a plurality of feed boards, and each of the feed boards has a respective group of one or more of the radiating elements mounted thereon. The antenna also includes a calibration port and a calibration circuit that has a calibration combiner that has an output that is coupled to the calibration port and a plurality of directional couplers that are coupled to the calibration combiner. At least a first portion of a first of the first directional couplers is implemented on a first of the feed boards.

Pursuant to further embodiments of the present invention, base station antennas are provided that include a backplane, a first plurality of radiating elements that are arranged to define a first column of radiating elements and a second plurality of radiating elements that are arranged to define a second column of radiating elements. These antennas further include a first electromechanical phase shifter that is electrically coupled between a first RF port of the antenna and the first column of radiating elements and a second electromechanical phase shifter that is electrically coupled between a second RF port of the antenna and the second column of radiating elements. These antennas also include a calibration circuit that includes a first directional coupler that is coupled along a first RF transmission path that extends between an input of the first electromechanical phase shifter and a first of the radiating elements in the first column of radiating elements and a second directional coupler that is coupled along a second RF transmission path that extends between an input of the second electromechanical phase shifter and a first of the radiating elements in the second column of radiating elements.

Pursuant to still further embodiments of the present invention, base station antennas are provided that include a backplane having a front surface and a rear surface and a plurality of radiating elements that extend forwardly from the backplane. These antennas further include a plurality of feed boards mounted in front of the backplane, where each feed board has a respective group of one or more of the plurality of radiating elements mounted thereon. The antennas also include a calibration circuit that includes a plurality of components that are mounted in front of the backplane and at least one additional component that is mounted behind the backplane.

Pursuant to still further embodiments of the present invention, base station antennas are provided that include a backplane, a plurality of RF ports including at least a first RF port and a second RF port, a plurality of radiating elements including at least a first radiating element and a second radiating element, each of the radiating elements extending forwardly from the backplane, a plurality of power dividers including at least a first power divider and a second power divider, the first power divider coupled between the first RF port and the first radiating element, and the second power divider coupled between the second RF port and the second radiating element, a calibration port and a calibration circuit. The calibration circuit includes a calibration combiner that has an output that is coupled to the calibration port and a plurality of directional couplers, including at least a first directional coupler and a second directional coupler, that are coupled to the calibration combiner. The first directional coupler is implemented on a printed circuit board of the first power divider.

DETAILED DESCRIPTION

Figure 1:
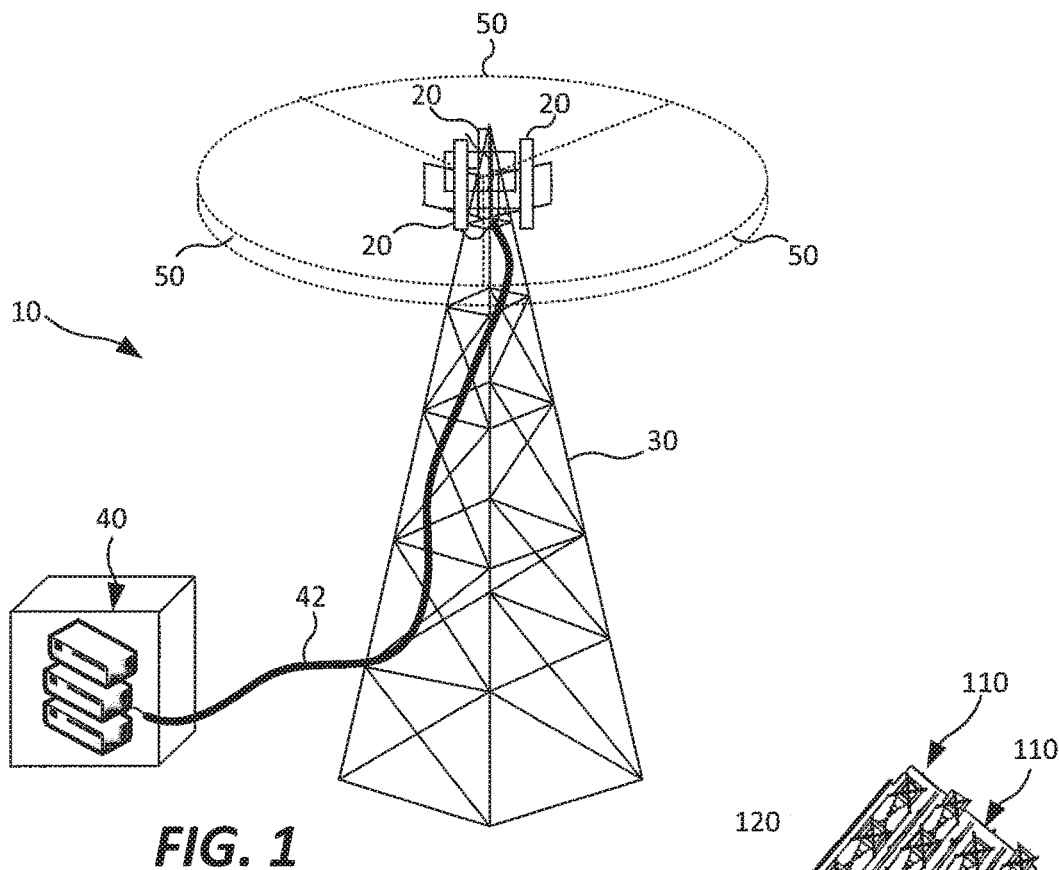
FIG. 1 is a schematic diagram illustrating a conventional cellular base station that has three base station antennas that are used to provide coverage to three sectors in the azimuth plane.

Pursuant to embodiments of the present invention, beam-forming base station antennas are provided that have improved calibration circuits. The calibration circuits may comprise a plurality of directional couplers and a calibration combiner that combines the outputs of the directional couplers. The calibration circuits may be implemented in new ways and at new locations within the antenna that may provide improved performance and/or reduce the cost of the antennas.

Conventionally, the calibration circuit for a beam-forming antenna is located just above the base plate of the antenna, and input cables are provided that directly connect each RF port on the antenna to a calibration circuit board on which the calibration circuit is implemented. Base station antennas having such a design may exhibit high tolerance levels for the calibration circuit, as the only variations in amplitude or phase that will be generated along the calibration path within the antenna are variations that may be introduced in the input cables and/or the calibration circuit. The beam-forming base station antennas according to embodiments of the present invention may have calibration circuits that are located, at least in part, on phase shifter printed circuit boards, on feed boards that support individual radiating elements, on power divider printed circuit boards and/or on diplexer printed circuit boards. This new approach allows the calibration circuit to identify relative amplitude and/or phase variations that may be introduced within much of the antenna feed network, which allows the radio to correct for such variations and provide improved antenna patterns. Additionally, moving the calibration circuit to the phase shifter printed circuit boards, feed boards, power divider printed circuit boards and/or on diplexer printed circuit boards may move the calibration circuit farther away from the RET actuators—which are typically located at the base of the antenna adjacent the antenna ports—which may reduce the possibility that the direct current motors included in the RET actuators introduce noise in the calibration circuit. Moreover, relocating the calibration circuit may reduce the number of elements/circuits that are located near the base of the antenna, which may allow reducing the overall length of many antenna designs. Relocating the calibration circuit may also reduce the number of cables (and associated solder joints) required in the antenna, which may both reduce cost and improve antenna performance. In addition, even when very short microstrip transmission lines are used on a calibration board, the insertion loss added by the microstrip transmission line and the two cable to microstrip printed circuit board transitions can be significant, such as on the order of 0.4 dB at 3.5 GHz. By locating some or all of the calibration circuit on microstrip or other printed circuit boards that are already present in the antenna it may be possible to reduce or eliminate this insertion loss, resulting in improved gain performance. As cellular base stations move to higher frequency bands such as the 3.5 GHz and 5 GHz frequency bands it may be particularly important to improve the efficiency of base station antennas in terms of both the physical layout and insertion loss performance of next-generation calibration circuits.

In some embodiments of the present invention, a monolithic feed board may be provided that includes at least one radiating element from each column of radiating elements that is included in the antenna. The calibration circuit may be fully implemented on this monolithic feed board. With this design, a calibration circuit may be added to an antenna without any increase in the number of connections (e.g., solder joints or connectors) along the RF signal paths through the antenna as compared to an antenna that does not include a calibration circuit. In fact, the only additional connections required by the inclusion of the calibration circuit are a pair of additional connections that connect the output of the calibration circuit to a calibration port on the antenna. In contrast, adding a calibration circuit board to a conventional antenna typically adds two connections per column of radiating elements, along with the two additional connections that are used to connect the calibration circuit to the calibration port. These extra connections may increase the cost of fabricating the antenna and are potential sources of passive intermodulation distortion that can degrade the performance of the antenna.

In other embodiments, the calibration circuit may be more distributed. For example, in one such embodiment, the radiating elements in each column of radiating elements may be mounted on one or more feed boards. One of the feed boards in each column may include a pair of directional couplers that are used to extract a small amount of energy from the respective radiators of a cross-polarized radiating element that is mounted thereon, along with a 2×1 combiner that is used to combine the two extracted RF signals. The outputs of the 2×1 combiners may then be coupled to another printed circuit board that includes an N×1 combiner circuit that combines the outputs of the 2×1 combiners to provide a calibration signal. A connection such as a cabling connection may be used to pass the calibration signal output by the N×1 combiner to a calibration port of the antenna.

In still other embodiments, first portions of each directional coupler of the calibration circuit may be implemented on one or more of the feed boards and a second portion of each directional coupler may be implemented on a calibration circuit board. Electromagnetic coupling may be used to couple RF energy from the first portion to the second portion of each directional coupler. In these embodiments, the feed boards may be positioned on the front side of a backplane of the antenna and the calibration circuit board may be positioned on the back side of the backplane. This approach may allow the use of small feed boards and may reduce the number of solder joints required to implement the calibration circuit.

In still other embodiments, the directional couplers of the calibration circuit may be implemented on the main printed circuit board of the phase shifters that are included in the antenna to implement remote electronic downtilt. For example, a microstrip directional coupler may be implemented along the "input trace" on the main printed circuit board of each phase shifter (i.e., the trace that connects the input cable to a power divider of the phase shifter). Each directional coupler extracts a small amount of the RF energy (which may be referred to as an "extracted calibration signal") that is then passed from the printed circuit board of the phase shifter to a calibration combiner circuit that combines the extracted calibration signals received from each phase shifter. An output of the calibration combiner circuit may be coupled to a calibration port of the antenna. In an alternative embodiment, the directional couplers may still be implemented on the main printed circuit board of each phase shifter, but may be implemented after the input RF signal has been sub-divided by the power divider circuit on the phase shifter printed circuit board. For example, conventional phase shifters for base station antennas typically split an input signal into X sub-components, and then apply variable phase shifts to X−1 of these sub-components. When such phase shifters are used, the directional couplers may be implemented along a transmission path for the sub-component of the input signal that is not phase-shifted. As with the above described embodiment, each extracted calibration signal may be passed from the printed circuit board of the phase shifter to a calibration combiner circuit that combines the extracted calibration signals, and the combined calibration signal may then be passed to a calibration port of the antenna.

In still further embodiments, the calibration circuit may be implemented, at least in part, on other printed circuit boards within a base station antenna such as, for example, diplexer printed circuit boards or power divider printed circuit boards of fixed-downtilt base station antennas.

Aspects of the present invention will now be in discussed in greater detail with reference to FIGS. 2-14, which illustrate example embodiments of base station antennas that include calibration circuits according to the present invention.

Figure 2:
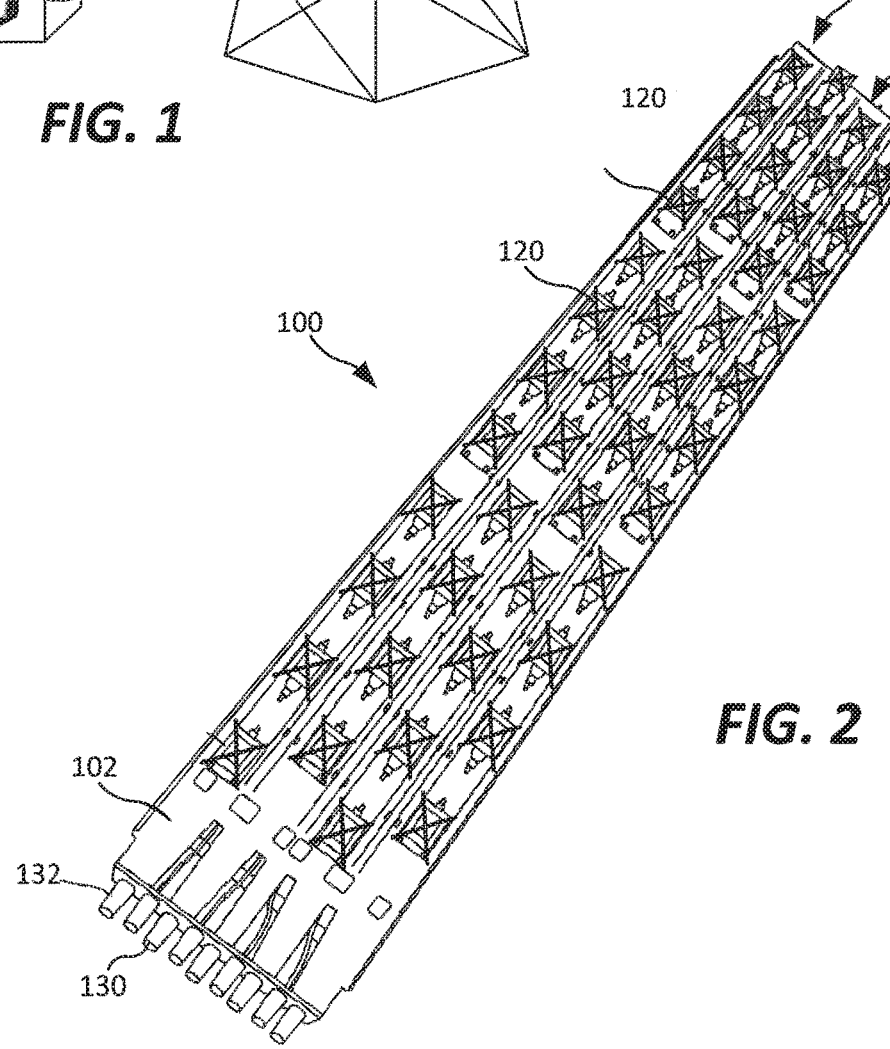
FIG. 2 is a schematic perspective view of a beam-forming antenna according to embodiments of the present invention with the radome removed.

FIG. 2 is a schematic perspective view of a beam-forming antenna 100 that may be designed to include any of the calibration circuits according to embodiments of the present invention. As shown in FIG. 2, the beam-forming antenna 100 has four columns 110 of dual-polarized radiating elements 120 that are mounted on a planar backplane 102. Each column 110 of radiating elements 120 has the same azimuth boresight pointing angle. The antenna 100 includes a total of RF eight ports 130, namely two RF ports 130 for each column (a port for each polarization), along with a ninth port 132 for calibration. A radome (not shown) is mounted over the radiating elements 120 to provide environmental protection.

Figure 3:
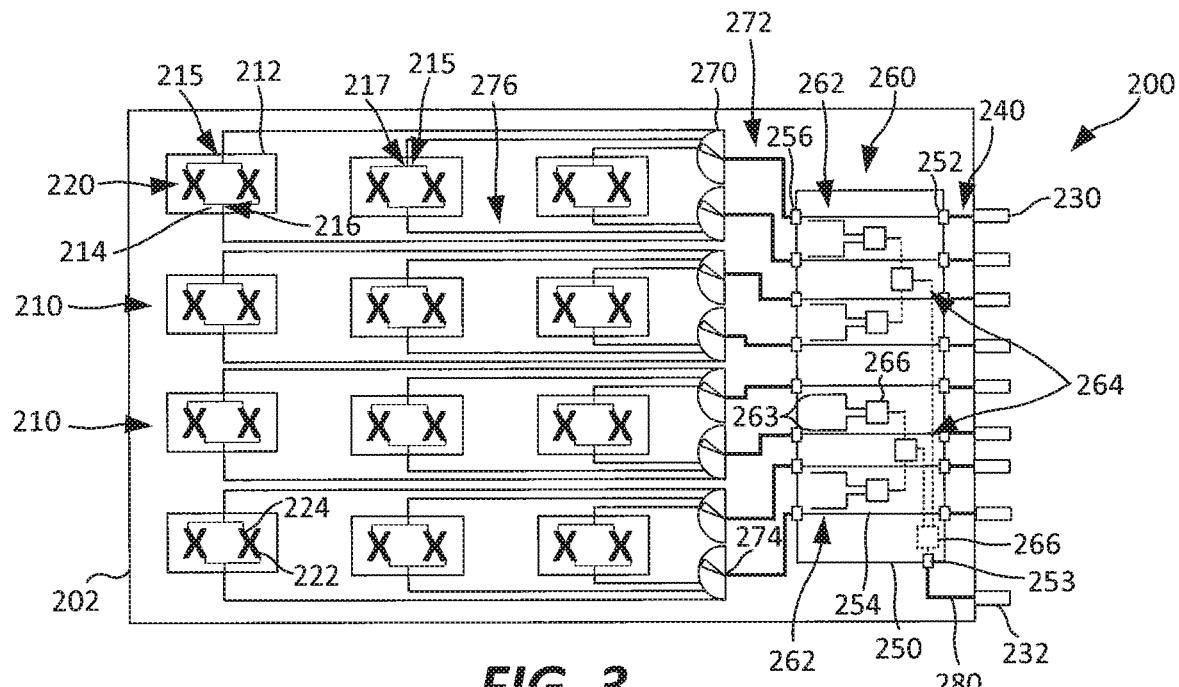
FIG. 3 is a schematic block diagram illustrating a base station antenna having a conventional calibration circuit.

FIG. 3 is a schematic diagram illustrating a base station antenna 200 that has a conventional calibration circuit. As shown in FIG. 3, the base station antenna 200 includes four columns 210 of dual-polarized radiating elements 220 that extend forwardly from a backplane 202. The base station antenna 200 also includes eight RF ports 230 and a calibration port 232.

RF signals may be coupled between the RF ports 230 and the columns 210 of radiating elements 220. Since dual-polarized radiating elements 220 are provided, two RF ports 230 are associated with each column 210, namely a first RF port 230 that feeds the first polarization radiators 222 (e.g., −45° dipoles) of the radiating elements 220 in the column 210 and a second RF port 230 that feeds the second polarization radiators 224 (e.g., +45° dipoles) of the radiating elements 220 in the column 210.

Eight input cables 240, which may be implemented, for example, as coaxial cables, may be provided that connect each of the RF ports 230 to a calibration circuit board 250. Typically each input cable 240 is soldered to a respective fixture 252 on the calibration circuit board 250 to provide an electrical path between each input cable 240 and corresponding RF transmission lines 254 on the calibration circuit board 250.

Each RF transmission line 254 may extend between a respective one of the fixtures 252 and a respective one of a plurality of fixtures 256. Each fixture 256 may receive a respective one of a plurality of jumper cables 272 that extend between the calibration circuit board 250 and a plurality of electromechanical phase shifters 270, as will be discussed in further detail below.

A calibration circuit 260 is provided on the calibration printed circuit board 250. The calibration circuit 260 may include, for example, a plurality of directional couplers 262, where the number of directional couplers 262 may correspond to the number of RF ports 230 (e.g., eight directional couplers in the example of FIG. 3), along with a calibration combiner 264. Each directional coupler 262 may be used to extract a small amount of any RF signal that passes along a respective one of the RF transmission lines 254. In the depicted embodiment, each directional coupler 262 is implemented as a trace 263 that extends generally in parallel next to a respective one of the RF transmission lines 254. When an RF signal travels along one of the RF transmission lines 254, a small portion of the RF energy will electromagnetically couple to the trace 263 so that together the trace 263 and the adjacent segment of the RF transmission line 254 form the directional coupler 262. The trace 263 may be referred to herein as the "tap port" of the directional coupler 262 as a small portion of the RF signal travelling along the RF transmission line 254 is tapped off to trace 263.

As can further be seen in FIG. 3, the calibration combiner 264 is implemented using seven 2×1 combiners 266 that together combine any RF signals present at the outputs of the eight directional couplers 262 into a single RF signal. As shown, the traces 263 of each set of two adjacent directional couplers 262 connect to the inputs of a respective one of four of the 2×1 combiners 266. A fifth 2×1 combiner 266 is used to combine the outputs of the first and second 2×1 combiners 266, and a sixth 2×1 combiner 266 is used to combine the outputs of the third and fourth 2×1 combiners 266. The seventh 2×1 combiner 266 combines the outputs of the fifth and sixth 2×1 combiners 266. Each 2×1 combiner 266 may be implemented using any conventional power coupler. For example, Wilkinson power couplers may be used to implement the combiners 266. The output of the seventh 2×1 combiner 266 connects to a calibration fixture 253, and a calibration cable 280 connects the calibration fixture 253 to the calibration port 232 on the antenna 200.

Each fixture 256 on the calibration circuit board 250 receives a respective jumper cable 272 that connects the fixture 256 to a respective one of a plurality of phase shifters 270. The phase shifters 270 are configured to split RF signals provided at an input port 274 thereof into a plurality of sub-components, and to then apply an adjustable phase taper to the RF sub-components. The outputs of each phase shifter 270 connect to the feed boards 212 of a respective column 210 of radiating elements in order to allow RF signals to pass between the phase shifters 270 and the feed boards 212. Each column 210 has an associated first polarization phase shifter 270 and an associated second polarization phase shifter 270. The first polarization phase shifter 270 for each column has three outputs that connect (via three respective phase cables 276) to respective RF transmission lines 214 that are provided on each the three feed boards 212 in the column 210. Each RF transmission line 214 passes through a respective splitter 216 so that the RF transmission line 214 may connect to the first polarization radiators 222 of each of the two radiating elements 220 that is mounted on the feed board 212. In this fashion, each output of the first polarization phase shifter 270 may be connected to the first polarization radiators 222 of the two radiating elements 220 on a respective one of the feed boards 212. Similarly, the second polarization phase shifter 270 for each column 210 has three outputs that connect (via respective phase cables 276) to respective RF transmission lines 215 that are provided on each the three feed boards 212 in the column 210. Each RF transmission line 215 passes through a respective splitter 217 so that the RF transmission line 215 may connect to the second polarization radiators 224 of each of the two radiating elements 220 that is mounted on the feed board 212. In this fashion, each output of the second polarization phase shifter 270 may be connected to the second polarization radiators 224 of the two radiating elements 220 on a respective one of the feed boards 212.

As discussed above, the calibration circuit 260 is used to identify any unintended variations in the amplitude and/or phase of the RF signals that are input to the different RF ports 230 of the beam-forming antenna 200. In particular, the calibration circuit 260 extracts a small amount of each of the RF signals that are input to antenna 200 and then combines these extracted "calibration" signals and passes them back to the radio that generated the RF signals. The radio may use this information to ensure that the amplitude and phase weights that are applied to the RF signals transmitted to the various columns 210 of radiating elements 220 provide optimized antenna beams.

The calibration circuit 260 in the base station antenna 200 may allow for the use of short input cables 240, since the calibration circuit board 250 may be located immediately adjacent the RF ports 230. Additionally, the calibration circuit 260 may readily pass tolerance tests as the short input cables 240 should exhibit little variation. There are, however, several disadvantages with the conventional calibration circuit design shown in FIG. 3. First, this design locates the calibration circuit board 250 adjacent the RF ports 230 at the base of the antenna 200, which is also the traditional location for RET actuators. The trend now is for base station antennas that include large numbers of independently controlled phase shifters, and hence many antennas include six, twelve or even more independently controlled phase shifters, requiring a corresponding number of RET actuators. As a result, antenna designers often need to position a large number of RET actuators near the base of an antenna, which often requires extending the length of the antenna. However, increasing the length of the antenna typically has negative consequences in terms of cost, weight and customer satisfaction.

Additionally, the RET actuators typically comprise DC motors. When the motors operate, they may generate noise that can negatively affect the RF signals on the calibration circuit board, particularly since the calibration circuit board is often implemented as an unshielded microstrip printed circuit board. Moreover, while conventional calibration circuits may do a good job of identifying amplitude and phase variations that may arise for RF signals passing along each RF transmission path between a radio and an antenna, the conventional calibration circuits do almost nothing to identify amplitude and phase variations that arise for RF signals passing through the feed network of the base station antenna. Consequently, if such variations exist (e.g., due to part of the antenna being in the sun while the rest is in the shade, resulting in a temperature variation that impacts the relative phases), the amplitude and phase weights used to perform the beam-forming may not be ideal, resulting in degraded antenna patterns.

Finally, as shown in FIG. 3, two cabling connections per column are typically made to the calibration circuit board 250, along with another two cabling connections for the calibration cable 280, resulting in eighteen additional connection points in the antenna 200. Each connection point is typically implemented by soldering an end of a cable to a printed circuit board. These soldered connections, however, are time-consuming to implement and are potential sources for passive intermodulation distortion ("PIM"). The calibration circuit designs according to embodiments of the present invention may reduce the number of solder joints required and/or may overcome other of the disadvantages associated with conventional calibration circuit designs.

Figure 4:
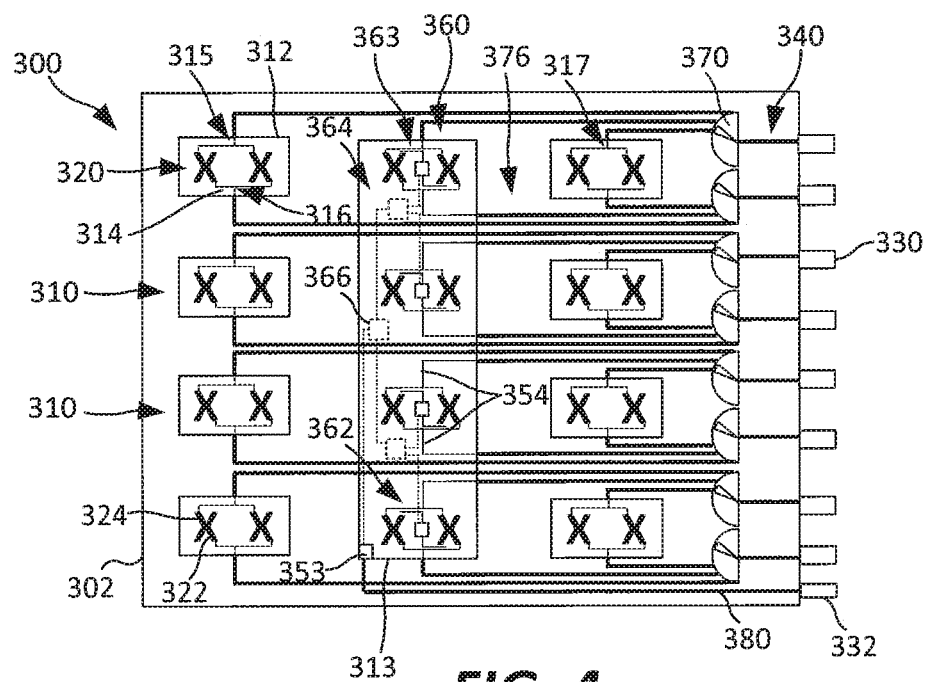
FIG. 4 is a schematic block diagram illustrating a base station antenna according to embodiments of the present invention that implements the calibration circuit on a feed board of the antenna.

FIG. 4 is a schematic diagram illustrating a base station antenna 300 according to embodiments of the present invention. As shown in FIG. 4, the base station antenna 300 includes four columns 310 of dual-polarized radiating elements 320. Each radiating element 320 may be mounted to extend forwardly from a backplane 302. Any appropriate radiating element may be used. In an example embodiment, each radiating element 320 may comprise a pair of stalks such as two printed circuit boards that extend forwardly from the backplane 302 that have a pair of dipole radiators 322, 324 formed or mounted thereon (only the dipole radiators 322, 324 are shown in FIG. 4). The stalks may be arranged in an "X" configuration, and the radiators 322, 324 may be arranged in a "cross-dipole" arrangement, with the first radiator 322 being disposed at an angle of −45° from a vertical axis, and the second radiator 324 being disposed at an angle of +45° from the vertical axis so that the two radiators 322, 324 will radiate at orthogonal polarizations.

The backplane 302 may comprise a unitary structure or may comprise a plurality of structures that are attached together. The backplane 302 may comprise, for example, a reflector that serves as a ground plane for the dual-polarized radiating elements 320. Each column 310 of radiating elements 320 may be oriented generally vertically with respect to the horizon when the base station antenna 300 is mounted for use. In the depicted embodiment, each column 310 includes a total of six radiating elements 320. It will be appreciated, however, that other numbers of radiating elements 320 may be included in each column 310, and that different numbers of columns 310 may be included in the antenna 300. The same is true with respect to the embodiments of the present invention discussed herein.

The base station antenna 300 includes eight RF ports 330 and a calibration port 332. Each RF port 330 may be coupled to a corresponding port of a multi-port radio (not shown) by a jumper cable (not shown). The RF ports 330 may be mounted, for example, in a base plate of the housing of antenna 300. RF signals are coupled between the RF ports 330 and the columns 310 of radiating elements 320. Since dual-polarized radiating elements 320 are provided, two RF ports 330 are associated with each column 310, namely a first RF port 330 that feeds the first polarization radiators 322 (e.g., −45° dipoles) of the radiating elements 320 in the column 310 and a second RF port 330 that feeds the second polarization radiators 324 (e.g., +45° dipoles) of the radiating elements 320 in the column 310.

Eight input cables 340, which may comprise, for example, coaxial cables, are provided that connect each of the RF ports 330 to a respective one of a plurality of electromechanical phase shifters 370. Each electromechanical phase shifter 370 is configured to split (using one or more power dividers such as directional couplers) an RF signal that is provided at an input port 374 thereof into a plurality of sub-components, and to apply an adjustable phase taper to the sub-components. The amount of phase taper may be adjusted by mechanically changing the setting of the electromechanical phase shifter 370. Since the calibration circuit board for antenna 300 is not located on the electrical paths between the RF ports 330 and the respective phase shifters 370, it may be possible to shorten antenna 300 as compared to antenna 200, as is schematically shown in FIG. 4.

The phase shifters 370 may be implemented, for example, using "wiper" phase shifters that each include a main printed circuit board and a "wiper" printed circuit board that may be rotated above the main printed circuit board. A wiper phase shifter may divide an input RF signal that is received at the main printed circuit board into a plurality of sub-components, and then capacitively couple at least some of these sub-components to the wiper printed circuit board. Further subdivision of the RF signal may occur on the wiper printed circuit board. The sub-components of the RF signal may be capacitively coupled from the wiper printed circuit board back to the main printed circuit board along a plurality of arc-shaped traces, where each arc has a different diameter. Each end of each arc-shaped trace may be connected to a radiating element or to a sub-group of radiating elements. By physically (mechanically) rotating the wiper printed circuit board above the main printed circuit board, the locations where the sub-components of the RF signal capacitively couple back to the main printed circuit board may be changed, which thus changes the length of the respective transmission paths from the phase shifter to an associated radiating element for each sub-component of the RF signal. The changes in these path lengths result in changes in the phases of the respective sub-components of the RF signal, and since the arcs have different radii, the phase changes along the different paths will be different. Typically, the phase taper is applied by applying positive phase shifts of various magnitudes (e.g., +X°) to one or more of the sub-components of the RF signal and by applying negative phase shifts of the same magnitudes (e.g., −X°) to one or more additional sub-components of the RF signal. Additionally, the phase shifters 370 typically include one transmission path that does not couple to the wiper printed circuit board and hence does not undergo an adjustable phase change. The wiper printed circuit board may be moved using an electromechanical actuator such as a DC motor that is connected to the wiper printed circuit board via a mechanical linkage.

Still referring to FIG. 4, the radiating elements 320 are mounted on a plurality of feed boards 312, 313. In the example embodiment depicted in FIG. 4, each feed board 312 has two radiating elements 320 mounted thereon. The two radiating elements 320 that are at the top of each column 310 are mounted on a feed board 312, and the two radiating elements 320 that are at the bottom of each column 310 are mounted on another feed board 312. The feed board 313 is a larger feed board that has eight radiating elements 320 mounted thereon, namely the middle two radiating elements 320 for each of the four columns 310. The feed board 313 acts as both a feed board that includes RF transmission lines that connect to the radiating elements 320 that are mounted on the feed board 313, and also as a calibration circuit board that includes a calibration circuit 360. Eight phase cables 376 are provided that connect a first output of each phase shifter 370 to one the feed boards 312 that are at the tops of the four columns 310 (each feed board 312 is fed by two phase cables 376, one for each of two polarizations). Another eight phase cables 376 connect the second output of each phase shifter 370 to the feed board 313, and another set of eight phase cables 376 connect the third output of each phase shifter 370 to one of the feed boards 312 that are at the bottoms of the four columns 310. The three outputs of each first polarization phase shifter 370 are coupled to the first polarization radiators 322 of the six radiating elements in a respective one of the columns 310, and the three outputs of each second polarization phase shifter 370 are coupled to the second polarization radiators 324 of the six radiating elements in a respective one of the columns 310. In some embodiments, the outputs of the phase shifters 370 that connect to the feed board 313 may be the outputs of the phase shifters 370 that are not subject to an adjustable phase shift.

The feed boards 312 may be identical to the feed boards 212 that are described above with respect to FIG. 3. In particular, each feed board 312 may include a first RF transmission line 314 that is coupled to one of the outputs of a respective one of the first polarization phase shifters 370 and a second RF transmission line 315 that is coupled to one of the outputs of a respective one of the second polarization phase shifters 370. On each feed board 312, the first RF transmission line 314 is coupled to a first splitter 316, and the outputs of the first splitter 316 connect to the first polarization radiators 322 of each of the two radiating elements 320 that are mounted on the feed board 312. Likewise, the second RF transmission line 315 is coupled to a second splitter 317, and the outputs of the second splitter 317 connect to the second polarization radiators 324 of each of the two radiating elements 320 that are mounted on the feed board 312.

The feed board 313 likewise includes first and second RF transmission lines 314, 315 and first and second splitters 316, 317 for each pair of radiating elements 320 mounted thereon, that are connected in the same fashion as the feed boards 312, with the only difference being that a single large feed board 313 is provided for the eight radiating elements 320 instead of four smaller feed boards 312.

A calibration circuit 360 is also provided on the feed board 313. The calibration circuit 360 may include, for example, a plurality of directional couplers 362, where the number of directional couplers 362 may correspond to the number of RF ports 330 (e.g., eight directional couplers 362), along with a calibration combiner 364. Each directional coupler 362 may be used to extract a small amount of any RF signal that passes along a respective one of the RF transmission lines 314, 315. In the depicted embodiment, each directional coupler 362 is implemented as a trace 363 that extends generally in parallel next to a respective one of the RF transmission lines 314, 315. When an RF signal travels along one of the RF transmission lines 314, 315, a small portion of the RF energy will electromagnetically couple to the trace 363 of the directional coupler 362 formed along the RF transmission line 314, 315. The trace 363 may be referred to herein as the "tap port" of the directional coupler 362 as a small portion of the RF signal travelling along the RF transmission line 314, 315 is tapped off to trace 363.

The calibration combiner 364 is implemented using seven 2×1 combiners 366 that together combine any RF signals present at the outputs of the eight directional couplers 362 into a single RF signal. As shown, the traces 363 of each set of two adjacent directional couplers 362 connect to the inputs of four of the 2×1 combiners 366. A fifth 2×1 combiner 366 is used to combine the outputs of the first and second 2×1 combiners 366, and a sixth 2×1 combiner 366 is used to combine the outputs of the third and fourth 2×1 combiners 366. The seventh 2×1 combiner 366 combines the outputs of the fifth and sixth 2×1 combiners 366. Each combiner 366 may be implemented using any conventional power coupler. For example, Wilkinson power couplers may be used to implement the combiners 366. The output of the seventh 2×1 combiner 366 connects to a calibration fixture 353, and a calibration cable 380 connects the calibration fixture to the calibration port 332 on the antenna 300.

Thus, the base station antenna 300 includes a backplane 302 and a plurality of radiating elements 320 that extend forwardly from the backplane 302. The antenna 300 further includes a plurality of feed boards 312, 313, and each of the feed boards 312, 313 has a respective group of one or more of the radiating elements 320 mounted thereon. The antenna 300 also includes a calibration port 332 and a calibration circuit 360 that has a calibration combiner 364 that has an output that is coupled to the calibration port 332 and a plurality of directional couplers 362 that are coupled to the calibration combiner 364. At least a first portion of a first of the first directional couplers 362 is implemented on the feed board 313.

The radiating elements 320 are arranged to define a first column 310 of radiating elements 320 and a second column 310 of radiating elements 320. The antenna 300 further include a first electromechanical phase shifter 370 that is electrically coupled between a first RF port 330 of the antenna 300 and the first column 310 of radiating elements 320 and a second electromechanical phase shifter 370 that is electrically coupled between a second RF port 330 of the antenna 300 and the second column 310 of radiating elements 320. The calibration circuit 360 includes a first directional coupler 362 that is coupled along a first RF transmission path that extends between an input of the first electromechanical phase shifter 370 and a first of the radiating elements 320 in the first column 310 and a second directional coupler 362 that is coupled along a second RF transmission path that extends between an input of the second electromechanical phase shifter 370 and a first of the radiating elements 320 in the second column 310.

The calibration circuit 360 is used to identify any unintended variations in the amplitude and/or phase of the RF signals that are input to the different RF ports 330 of the beam-forming antenna 300. In particular, the calibration circuit 360 couples a small amount of the RF signal input to antenna 300 through each RF port 330 and then combines these extracted "calibration" signals and passes them back to the radio that generated the RF signals. When calibration operations are performed, the radio may transmit RF signals to each RF port 330 at different frequencies or RF signals that each include a unique code so that the receiver at the radio can differentiate between the received calibration signals to determine the relative amplitude and phase of each calibration signal. The radio may use this information to ensure that the amplitude and phase weights that are applied to the RF signals transmitted to the various columns 310 of radiating elements 320 provide optimized antenna beams.

The calibration circuit 360 may have a number of advantages over prior art calibration circuits. First, the calibration circuit board 313 is moved away from the RF ports 330. This reduces the effect that RET actuators may have on the calibration circuit, and also reduces the number of elements that are located at the base of the antenna 300. This may allow for a shorter antenna. Additionally, since the calibration circuit board is located on a feed board, the calibration circuit 360 may also identify amplitude and phase variations that arise in the feed network for antenna 300, and hence the radio may adjust the amplitude and phase weights to correct for any such variations, allowing for improved beam-forming. Moreover, as can be seen by comparing FIGS. 2 and 3, the antenna 300 includes eight less cables (namely the jumper cables 272 of antenna 200 are not included in antenna 300, and hence sixteen fewer solder joints may be required in antenna 300. Solder joints are time consuming to complete in manufacturing and are a potential source of passive intermodulation distortion. Accordingly, the base station antenna 300 may be cheaper to manufacture and may provide improved performance as compared to prior art base station antennas.

Figure 5:
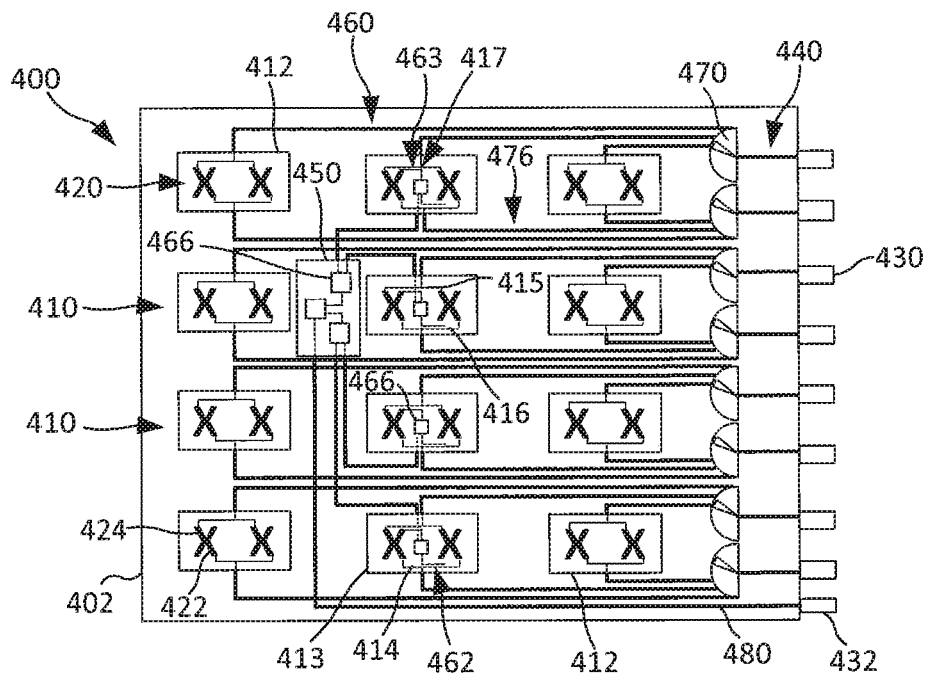
FIG. 5 is a schematic block diagram illustrating a base station antenna according to further embodiments of the present invention.

FIG. 5 is a schematic diagram illustrating a base station antenna 400 according to further embodiments of the present invention. The base station antenna 400 includes attributes of the conventional base station antenna 200 as well as the base station antenna 300, as will be clear from the description below.

The base station antenna 400 includes four columns 410 of dual-polarized radiating elements 420 having first and second radiators 422, 424. The radiating elements 420 are mounted on a plurality of feed boards 412, 413. Each radiating element 420 extends forwardly from a backplane 402. The base station antenna 400 further includes eight RF ports 430 and a calibration port 432. Input cables 440 connect each of the RF ports 430 to a respective one of a plurality of electromechanical phase shifters 470, and phase cables 476 connect the outputs of the phase shifters 470 to the feed boards 412, 413. The backplane 402, radiating elements 420, RF ports 430, calibration port 432, input cables 440, phase shifters 470 and phase cables 476 may be identical to the backplane 302, radiating elements 320, RF ports 330, calibration port 332, input cables 340, phase shifters 370 and phase cables 376 that are discussed above, and hence further description thereof will be omitted here. The base station antenna 400 further includes a calibration circuit 460, which will be described in more detail below.

Each feed board 412, 413 may have two radiating elements 420 mounted thereon. The feed boards 412 may be identical to the feed boards 312, and hence further description thereof will be omitted here. The feed boards 413, in conjunction with a calibration circuit board 450, provide a different way of implementing the calibration circuit along the electrical paths between the phase shifters and the radiating elements of a base station antenna.

In particular, in the base station antenna 400, four small feed boards 413 are provided in contrast to the larger feed board 313 included in the base station antenna 300. Each feed board 413 includes a first RF transmission line 414 that is coupled to one of the outputs of a respective one of the first polarization phase shifters 470 and a second RF transmission line 415 that is coupled to one of the outputs of a respective one of the second polarization phase shifters 470. The first RF transmission line 414 is coupled to a first splitter 416, and the outputs of the first splitter connect to the first polarization radiators 422 of each of the two radiating elements 420 that are mounted on the feed board 413. Likewise, the second RF transmission line 415 is coupled to a second splitter 417, and the outputs of the second splitter 417 connect to the second polarization radiators 424 of each of the two radiating elements 420 that are mounted on the feed board 413.

In addition, each feed board 413 includes a portion of the calibration circuit 460. As in the other embodiments discussed herein, the calibration circuit 460 may comprise eight directional couplers 462 that are used to tap off a small portion of the RF energy that is input at each RF port 430 of antenna 400, along with a combiner circuit 464 that combines the tapped RF energy into a single composite RF signal. The directional couplers 462 may be implemented in same manner as the directional couplers 362 described above, namely as a trace 463 that extends generally in parallel next to a respective one of the RF transmission lines 414, 415. As shown in FIG. 5, each feed board 413 includes two of the directional couplers 462 that are used to tap a small portion of the RF energy that is fed to the respective first and second radiators 422, 424 of the radiating elements 420 that are mounted on each feed board 413. In some embodiments, the outputs of the phase shifters 470 that connect to the feed boards 413 may be the outputs of the phase shifters 470 that are not subject to an adjustable phase shift. The directional couplers 462 may be identical to the above-described directional couplers 362, and hence further description thereof will be omitted. The tap ports of the two directional couplers 462 on each feed board 413 are input to a 2×1 combiner 466 that is formed on the feed board 413 that combines the two tapped RF signals into a composite signal. The output of each "feed board" 2×1 combiner 466 may be coupled by a cabling connection (or some other suitable transmission line structure) to a calibration circuit board 450.

The calibration circuit board 450 may include three additional 2×1 combiners 466 (or a single 4×1 combiner) that combines the outputs of the four 2×1 combiners 466 that are provided on the respective feed boards 413. The seven 2×1 combiners 466 may be arranged in the same manner as the combiners 366 with the exception that the 2×1 combiners 466 are distributed across multiple circuit boards 413, 450, while the combiners 366 were all implemented on the same calibration circuit board 313. The 2×1 combiners 466 may be implemented in the same manner as the combiners 366 (e.g., as Wilkinson power combiners), and the output of the last 2×1 combiner 466 in the tree structure may be electrically connected to the calibration port 432 via a calibration cable 480.

As is readily apparent, the calibration circuit 460 is similar to the calibration circuit 360 that is described above, with the primary difference being that the one large circuit board 313 included in base station antenna 300 is replaced with four smaller feed boards 413 and a small calibration circuit board 450 in the base station antenna 400. This approach eliminates the need for a large circuit board (which tend to be expensive), and allows the feed boards 413 to be very similar to the feed boards 412, which may simplify the design process. Additionally, it should be noted that the feed boards (e.g., feed boards 312, 313, 412, 413) are typically mounted on the front side of the backplane for the antenna. As a result, radiation emitted by the radiating elements of the antenna may be incident at the feed boards, which has the potential to inject noise into the calibration signal. In the base station antenna 400, the calibration circuit board 450 may be mounted on the rear side of the backplane 402, where the backplane 402 shields the circuitry thereon from RF energy emitted by the radiating elements 420. Thus, the calibration circuit 460 in base station antenna 400 may have a reduced susceptibility to such RF noise as part of the calibration circuit 460 is mounted behind the backplane 402. However, the base station antenna 400 may include four more cabling connections (and hence eight more solder joints) as compared to the base station antenna 300 as cabling connections may be used to connect the output of each 2×1 combiner 466 on the four feed boards 413 to the calibration circuit board 450.

Figure 6:
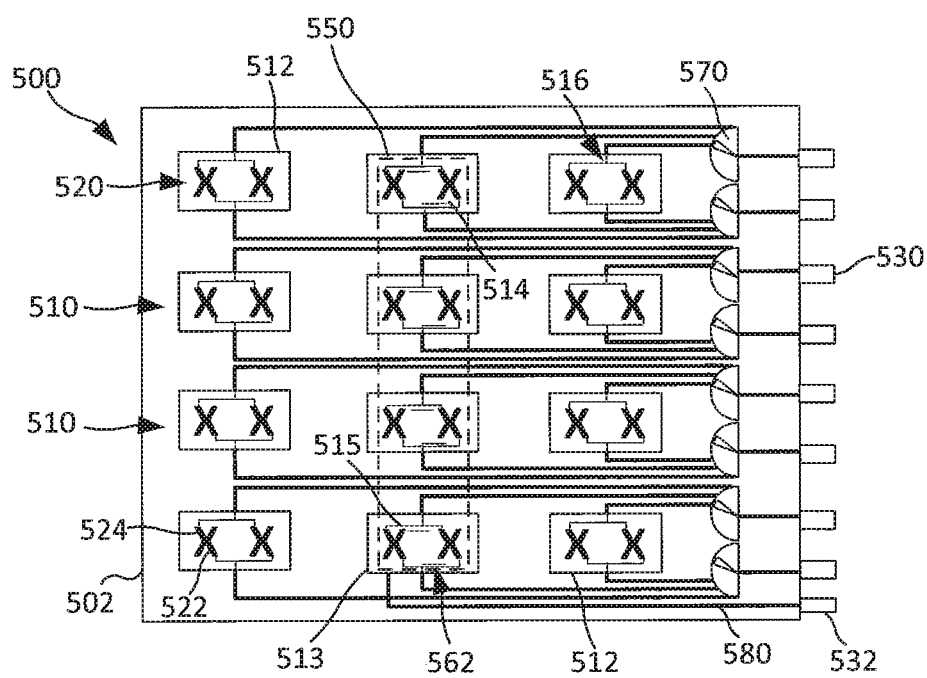
FIG. 6 is a schematic block diagram illustrating a base station antenna according to yet additional embodiments of the present invention.

FIG. 6 is a schematic diagram illustrating a base station antenna 500 according to yet additional embodiments of the present invention. The base station antenna 500 may combine some of the advantages provided in the base station antennas 300 and 400 that are described above. Accordingly, the description that follows will focus on the differences between base station antenna 500 and the base station antennas 300, 400 described above.

Figure 7:
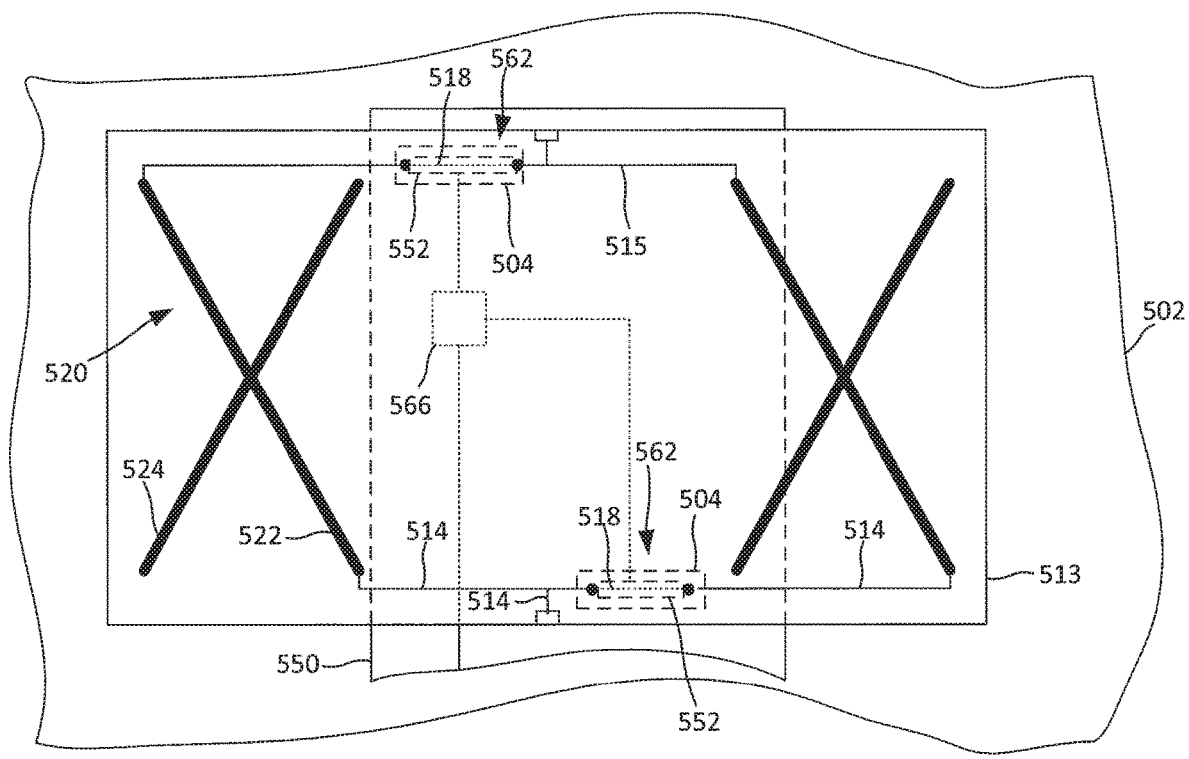
FIG. 7 is a schematic plan view illustrating how directional couplers included in the base station antenna of FIG. 6 may be formed by electromagnetically coupling RF transmission lines on a feed board to conductive structures on an underlying calibration circuit board through openings in a backplane of an antenna.
Figure 8:
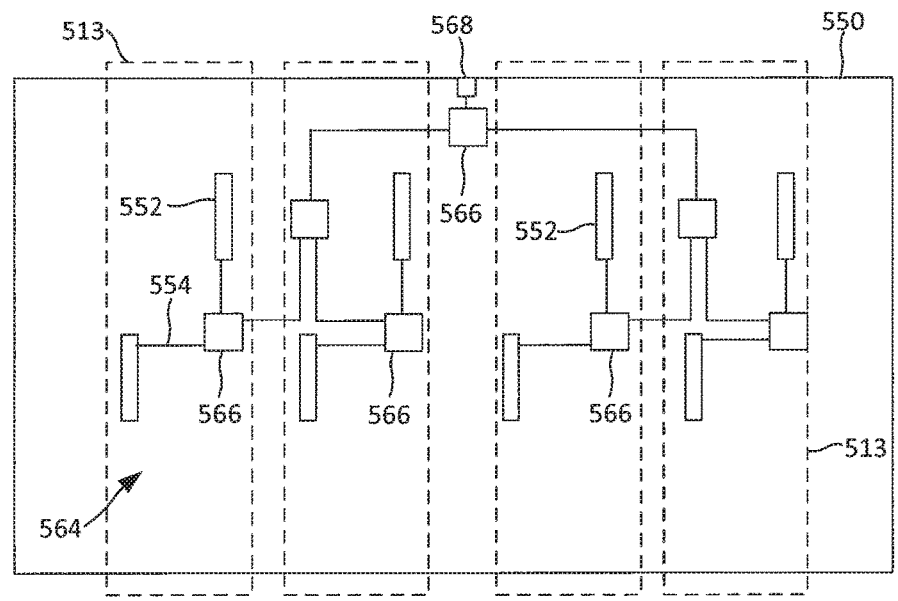
FIG. 8 is a schematic front view of the calibration circuit board included in the base station antenna of FIG. 6 that illustrates the calibration combiner circuit implemented thereon.

As shown in FIG. 6, the base station antenna 500 includes four feed boards 513 and a calibration circuit board 550. The feed boards 513 may be similar to the conventional feed boards 212, except that the feed boards 513 may be designed to facilitate coupling RF energy from the RF transmission lines 514, 515 formed thereon through openings in the backplane 502 to traces (or other structures) on the calibration circuit board 550. FIG. 7 is an enlarged schematic front view of one of the feed boards 513 and portions of the backplane 502 and calibration circuit board 550 that are positioned behind the feed board 513 that better illustrate the design and operation of the calibration circuit 560 that is included in base station antenna 500. FIG. 8 is a schematic front view of the calibration circuit board 550 that illustrates the calibration combiner circuit 564 implemented thereon. It should be noted that FIG. 6 does not illustrate the individual circuit elements included on the calibration circuit board 550 in order to simplify the drawing, but these circuit elements are shown in FIG. 8.

Referring to FIGS. 6-8, the backplane 502 may have a pair of openings 504 behind each feed board 513. The calibration circuit board 550 is positioned behind the backplane 502. The pair of RF transmission lines 514, 515 provided on each feedboard 513 that carry RF energy output from the phase shifters 570 to the respective first and second radiators 522, 524 of the radiating elements 520 may, for example, include segments 518 that run on the back side of the feed board 513 in the vicinity of the openings 504 in the back plane 502. The calibration circuit board 550 may include conductive structures 552 such as, for example, widened terraces of conductive pads that are directly behind each opening 504 in the backplane 502. RF energy that is present on one of the segments 518 may thus electromagnetically couple from the segment 518, through the opening 504 in the backplane 502, to the corresponding conductive structure 552. Thus, it will be appreciated that each combination of a segment 518 and a conductive structure 552 forms a directional coupler 562 that taps a small portion of the RF energy that is flowing on a respective one of the RF transmission lines 514. Thus, in the embodiment of FIG. 6 the directional couplers 562 of the calibration circuit 560 are implemented as electromagnetic couplings between different circuit board structures.

As shown in FIG. 8, the calibration combiner 564 is formed on the calibration circuit board 550. The calibration combiner 564 is used to combine the outputs of the directional couplers 562 to provide a composite calibration signal that is routed to the calibration port 532 of antenna 500. As shown in FIG. 8, the calibration circuit board 550 includes eight conductive structures (shown as conductive pads) 552 that may be located directly behind each opening 504 in the backplane 502 (see FIG. 7). As described above, each conductive structure 552 forms a portion of a respective one of the directional couplers 562 of the calibration circuit 560. Conductive traces 554 connect each conductive structure 552 that is associated with a particular feed board 513 (the locations of the feed boards 513 are shown using dashed boxes in FIG. 8) to a respective 2×1 combiner 566. The outputs of four 2×1 combiners 566 that connect to the conductive structures are connected to the inputs to two additional 2×1 combiners 566, and the outputs of the two additional 2×1 combiners 566 are coupled to the inputs of a final 2×1 combiner 566 to form a three-level tree structure of 2×1 combiners 566 that acts as an 8×1 calibration combiner 564. The output of the final 2×1 combiner 566 is coupled to a fixture 568 that may receive a calibration cable 580.

Thus, the base station antenna 500 includes a backplane 502 having a front surface and a rear surface and a plurality of radiating elements 520 that extend forwardly from the backplane 502. A plurality of feed boards 512, 513 mounted in front of the backplane 502, where each feed board 512, 513 has a respective group of one or more of the radiating elements 520 mounted thereon. The antenna 500 also includes a calibration circuit 560 that includes a plurality of components 516 that are mounted in front of the backplane 502 and at least one additional component 552, 566 that is mounted behind the backplane 502.

The calibration circuit design of base station antenna 500 may have a number of advantages. First, this arrangement allows the calibration circuit board 550 to be implemented on the back side of the backplane 502, and hence the backplane 502 shields the calibration circuit 560 from RF energy emitted by the radiating elements 520. Additionally, all of the calibration combiners 566 may be implemented on the same circuit board 550, and hence the base station antenna 500 may have fewer cabling connections than, for example, the base station antenna 400.

Figure 9:
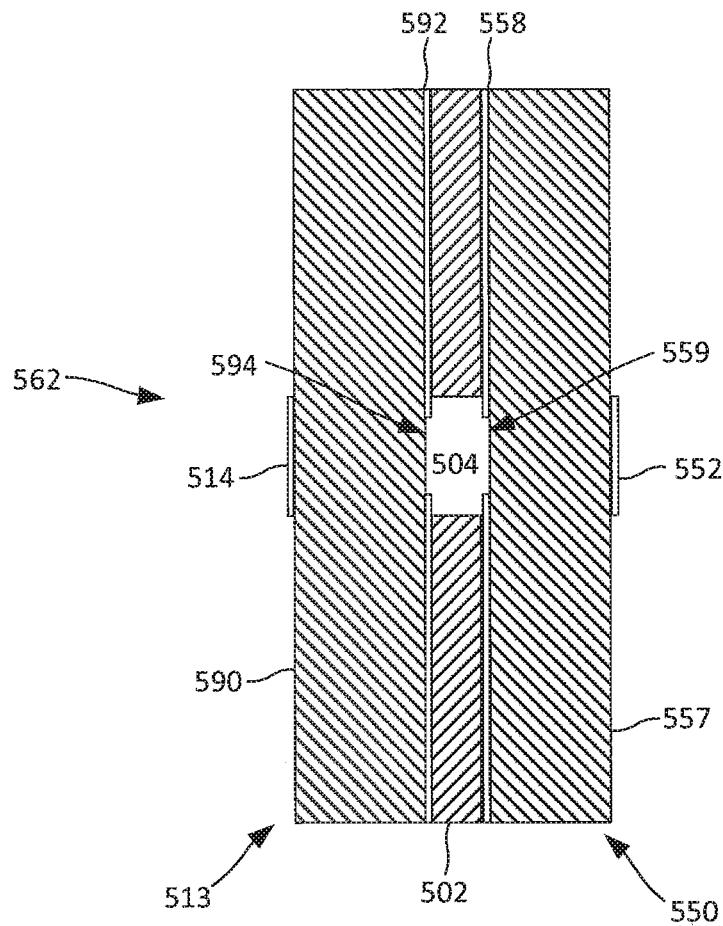
FIG. 9 is a schematic cross-sectional diagram illustrating another implementation of the directional couplers included in the base station antenna of FIG. 6.

FIG. 9 is a schematic cross-sectional diagram illustrating another technique for implementing the directional couplers 562 that are included in the base station antenna 500 of FIG. 6. In particular, FIG. 9 is a thin cross-section taken through the feed board 513, backplane 502 and calibration circuit board 550 of FIG. 6 that illustrates an alternative implementation of one of the directional couplers 562 included in the base station antenna 500 that electromagnetically couples RF energy through openings 504 in the backplane 502.

In practice, the feed boards and calibration circuit boards included in base station antennas are commonly formed using microstrip printed circuit boards, with stripline or other circuit board implementations being used in certain situations. As known to those of skill in the art, a microstrip printed circuit board is typically implemented as a dielectric substrate that has a conductive ground plane formed on a first major surface thereof (e.g., a bottom surface), and a conductive pattern formed on the opposed major surface (e.g., the top surface). The conductive pattern may comprise one or more traces that define RF transmission lines and may further include conductive pads or other conductive structures that form circuit elements, input/output ports and the like. The ground plane is typically formed as a continuous or near continuous sheet of metal that substantially or completely covers the bottom surface of the dielectric substrate. FIG. 9 illustrates one practical implementation of the directional couplers 562 of base station antenna 500 when the feed boards 513 and calibration circuit board 550 are formed as microstrip printed circuit boards.

Referring to the schematic cross-sectional view of FIG. 9, it can be seen that the calibration circuit board 550 may be positioned immediately adjacent and behind the backplane 502 while the feed board 513 may be positioned immediately adjacent and in front of the backplane 502. The feed board 513 is a microstrip feed board that includes a dielectric substrate 590 that has a ground plane 592 formed on a rear surface thereof, and the trace of the RF transmission line 514 is formed on the forward surface of the dielectric substrate 517. As shown in FIG. 9, an opening 594 is provided in the ground plane 592 behind the trace of the RF transmission line 514. The calibration circuit board 550 likewise is implemented as a microstrip feed board that includes a dielectric substrate 557 that has a ground plane 558 formed on a forward surface thereof, and the conductive structure 552 is formed on the rear surface of the dielectric substrate 557. As is further shown in FIG. 9, an opening 559 is provided in the ground plane 558 in front of the conductive structure 552. The openings 594, 559 in the respective ground planes 592, 558 of the feed board 513 and the calibration circuit board 550 are aligned with each other and are further aligned with the above-described opening 504 in the backplane 502. Consequently, when an RF signal is transmitted on the feed board RF transmission line 514 a small portion of the RF energy will couple through the opening 594 in the ground plane 592 of feed board 513, through the opening 504 in backplane 502, through the opening 559 in the ground plane 558 of the calibration circuit board 550 to an RF transmission line 554 on calibration circuit board 550 that includes and/or is connected to the conductive structure 552. Thus, FIG. 9 illustrates a practical implementation of one of the directional couplers 562 included in the calibration circuit 560 of base station antenna 500. It will be appreciated that the cross-section of FIG. 9 is "thin" in the sense that it is taken through a small section of the antenna and corresponding to one of the openings 504 in the backplane 502 hence does not show portions of the backplane 502, feed board 513 and calibration circuit board 550 that are outside the region of the opening 504 to more clearly illustrate the opening 504 as well as the openings 594, 559 in the respective feed board and calibration circuit board ground planes 592, 558.

In the example of FIG. 9, the directional coupler 562 is formed through a single opening 504 in the backplane 502 (and corresponding openings 594, 559 in the ground planes 592, 558). It will be appreciated, however, that two or more sets of openings may be provided to improve the directivity of the directional coupler 562 in other embodiments.

Figure 10:
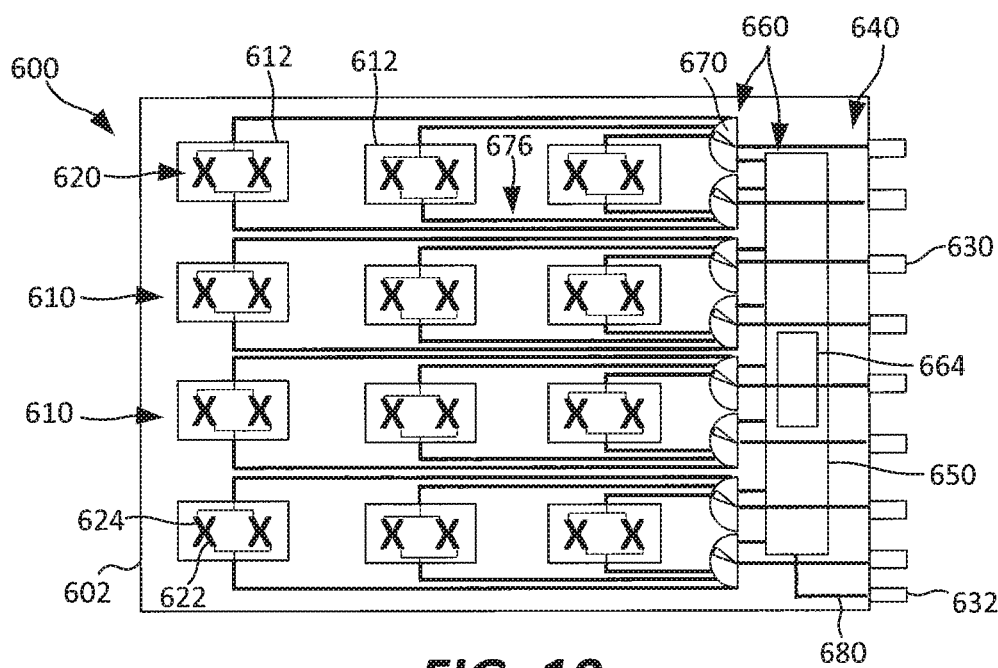
FIG. 10 is a schematic block diagram illustrating a base station antenna according to still further embodiments of the present invention.

FIG. 10 is a schematic diagram illustrating a base station antenna 600 according to still further embodiments of the present invention. The base station antenna 600 is similar to the base station antenna 400 described above, but has at least two fundamental differences. First, in the base station antenna 600, the directional couplers of the calibration circuit 660 are implemented in the phase shifters 670 as opposed to on the feed boards 413 as is done in the base station antenna 400. Second, in the base station antenna 600, the combiner portion of the calibration circuit is fully implemented on a single calibration circuit board 650. The discussion below will focus on these two aspects of base station antenna 600 that differ from base station antenna 400.

As shown in FIG. 10, the base station antenna 600 may include four columns 610 of dual-polarized radiating elements 620 having first and second radiators 622, 624 that are mounted on a backplane 602. The radiating elements 620 may be mounted on feed boards 612. In this embodiment all of the feed boards 612 may be identical. The base station antenna 600 further includes eight RF ports 630 and a calibration port 632. Input cables 640 connect each of the RF ports 630 to a respective one of a plurality of electromechanical phase shifters 670, and phase cables 676 connect the outputs of the phase shifters 670 to the feed boards 612. The backplane 602, feed boards 612, radiating elements 620, RF ports 630, calibration port 632, input cables 640 and phase cables 676 may be identical to the backplane 402, feed boards 412, radiating elements 420, RF ports 430, calibration port 432, input cables 440 and phase cables 476 that are discussed above, and hence further description thereof will be omitted here. The base station antenna 600 further includes a calibration circuit 660, which will be described in more detail below. The calibration circuit 660 includes the above-mentioned calibration circuit board 650 as well as eight directional couplers 662 that are formed as part of the respective eight phase shifters 670.

Figure 11:
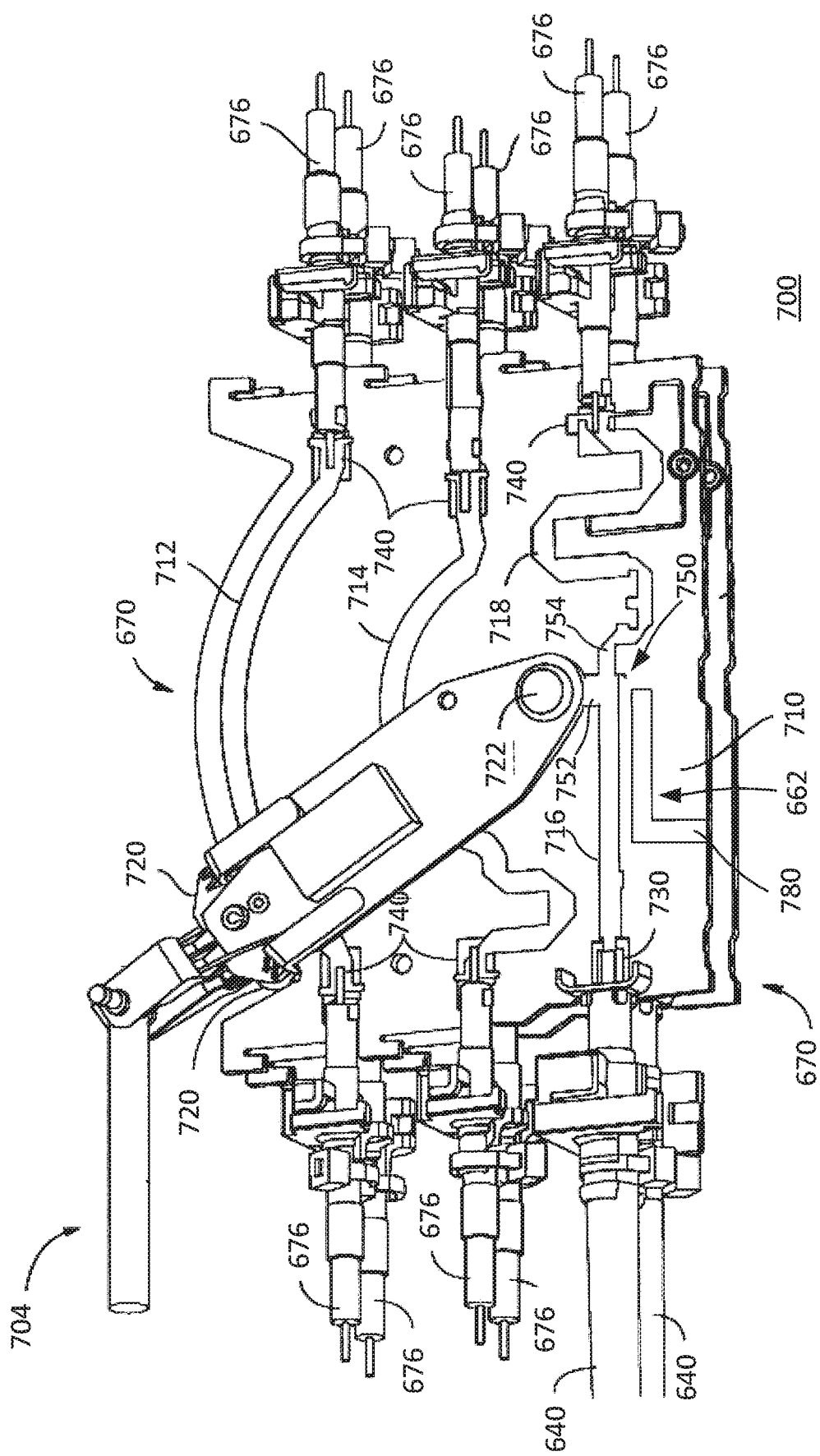
FIG. 11 is a front perspective view of a phase shifter assembly that may be included in the base station antenna of FIG. 10.

FIG. 11 is a perspective view of a dual rotating wiper phase shifter assembly 700 that may be used to implement two of the electromechanical phase shifters 670 that are included in base station antenna 600 (one for each of the two polarizations). A total of four such phase shifter assemblies 700 are included in the base station antenna 600, namely one assembly 700 for each column of radiating elements 620. As shown in FIG. 11, the dual rotating wiper phase shifter assembly 700 includes first and second phase shifters 670 that are arranged back-to-back in a front-back relationship. The two phase shifters 670 may be identical and hence only the front phase shifter 670 will be described herein.

As shown in FIG. 11, the front phase shifter 670 includes a main (stationary) printed circuit board 710 and a rotatable wiper printed circuit board 720 that is rotatably mounted on the main printed circuit board 710 via a pivot pin 722. The position of the wiper printed circuit board 720 above the main printed circuit board 710 is controlled by the position of a mechanical linkage 704 (partially shown in FIG. 11) that extends between an output member of a RET actuator and the phase shifter 700. As the position of the mechanical linkage 704 changes, the wiper printed circuit board 720 rotates above the main printed circuit board 710 in order to change the relative phases of the sub-components of an RF signal that are output by the phase shifter 670.

The main printed circuit board 710 includes transmission line traces 712, 714, 716, 718. The transmission line traces 712, 714 are generally arcuate. The first arcuate transmission line trace 712 is disposed along an outer circumference of the main printed circuit board 710, and the second arcuate transmission line trace 714 is disposed on a shorter radius concentrically within the outer transmission line trace 712. Transmission line trace 716 connects an input pad 730 on main printed circuit board 710 to an input of a directional coupler 750 that is implemented on the main printed circuit board 710. A first output 752 of the directional coupler 750 connects to a pad (not shown) on the main printed circuit board 710. A second output 754 of the directional coupler 750 connects to transmission line trace 718. Transmission line trace 718 extends between the directional coupler 750 and one of a plurality of output pads 740 provided along the edges of the main printed circuit board 710.

A center conductor of an input cable 640 of base station antenna 600 (see FIG. 10) may be soldered to the input pad 730 (and the ground conductor of the input cable may be soldered to the ground plane of the main printed circuit board 710). An RF signal may pass from one of the RF ports 630 of base station antenna 600 (see FIG. 10) to the input pad 730 over the input cable 640. The RF signal will travel along the transmission line trace 716 to the directional coupler 750. The directional coupler 750 may be configured to unevenly divide RF energy input thereto, passing most of the RF energy (e.g., about 80%) to the first output 752 and passing the remainder of the input RF energy to the second output 754. The RF energy passed to the first output 752 is then capacitively coupled to a transmission line trace (not visible in FIG. 11) on the wiper printed circuit board 720. Another directional coupler (not shown) may be provided along the transmission line trace on the wiper printed circuit board 720 that divides the RF energy passed to the wiper printed circuit board 720 into two sub-components. These two sub-components of the RF signal are capacitively coupled from the outputs of the directional coupler on the wiper printed circuit board 720 to the respective transmission line traces 712, 714 on the main printed circuit board. The sub-component of the RF signal coupled to transmission line trace 714 may split into two sub-components, with the first sub-component travelling to the left along transmission line trace 714 (from the vantage point of FIG. 11) and the second sub-component travelling to the right along transmission line trace 714. Similarly, the sub-component of the RF signal coupled to transmission line trace 712 may likewise split into two sub-components, with the first sub-component travelling to the left along transmission line trace 712 and the second sub-component travelling to the right along transmission line trace 712. Each end of each transmission line trace 712, 714 may be coupled to a respective output pad 740. Thus, the phase shifter 670 splits an RF signal input at pad 730 into five sub-components that are passed to the five respective output pads 740.

As the wiper printed circuit board 720 moves, an electrical path length from the input pad 730 of phase shifter 670 to four of the five output pads 740 (namely the output pads 740 that are connected to arcuate transmission line traces 712, 714) changes. For example, as the wiper printed circuit board 720 moves to the left it shortens the electrical length of the path from the input pad 730 to the output pad 740 connected to the left side of transmission line trace 712 (which connects to a first radiating element 620), while the electrical length from the input pad 730 to the output pad 740 connected to the right side of transmission line trace 712 (which connects to a second radiating element 620) increases by a corresponding amount. These changes in path lengths result in phase shifts to the signals received at the output pads 740 connected to transmission line trace 712 relative to, for example, the output pad 740 connected to transmission line trace 718.

As shown in FIG. 11, the rotating wiper printed circuit board 720 of the back phase shifter 670 may be controlled by the same mechanical linkage 704 as the rotating wiper printed circuit board 720 of the top phase shifter 670. This arrangement is commonly used when the columns 610 of radiating elements 620 are columns 610 of dual polarized radiating elements 620, as the same phase shift typically is applied to the RF signals transmitted at each of the two orthogonal polarizations. Thus, a single mechanical linkage 704 may be used to control the positions of the wiper printed circuit boards 720 on both phase shifters 670.

The main printed circuit 710 further includes a directional coupler 662 that is used to tap off a small portion of an RF signal that is input at input pad 730. The directional coupler 662 may be implemented, for example, as a microstrip trace that runs alongside transmission line trace 716, or as any other suitable directional coupler design. A portion of an RF signal passing along transmission line trace 716 may electromagnetically couple to the trace of the directional coupler 662 and be passed to a calibration pad 780. In an example embodiment, about 3-6% of the RF energy may couple to the trace of the directional coupler 662. One end of an RF transmission line (not shown) such as, for example, an end of a coaxial cable, may be connected to the calibration pad 780. The other end of the coaxial cable may be connected to the calibration printed circuit board 650 (see FIG. 10).

Referring again to FIG. 10, the calibration printed circuit board 650 includes a combiner circuit 664 that combines the RF energy tapped from each of the phase shifters 670 into a single composite RF signal. The combiner circuit 664 is shown schematically in FIG. 10 as a box. The combiner circuit 664 may, comprise, for example, seven 2×1 power combiners that combine the eight tapped signals into a single composite calibration signal. The seven 2×1 combiners may, for example, be arranged in the same manner as the combiners 366 that are discussed above with reference to FIG. 4, and may be implemented in the same manner (e.g., as Wilkinson power combiners). The output of the last 2×1 combiner in the tree structure may be electrically connected to the calibration port 632 via a calibration cable 680 as is shown in FIG. 10.

The calibration circuit 660 is similar to the calibration circuit 460 that is described above, with the primary difference being that the calibration signals are tapped from the phase shifters 670 as opposed to being tapped from the feed boards. This approach may be advantageous because the phase shifters 670 are located on the rear side of the reflector 602, whereas the feed boards 612 are typically located on the front side of the reflector 602, and hence it may be easier to connect the directional couplers to the calibration printed circuit board 650 if the directional couplers 662 are implemented as part of the phase shifters 670. Additionally, by moving the directional couplers 662 from the feed boards 612 to the main printed circuit boards 710 of the phase shifters 670, the possibility of radiation emitted by the radiating elements 620 of the base station antenna 600 injecting noise into the calibration signal may be reduced.

Figure 12:
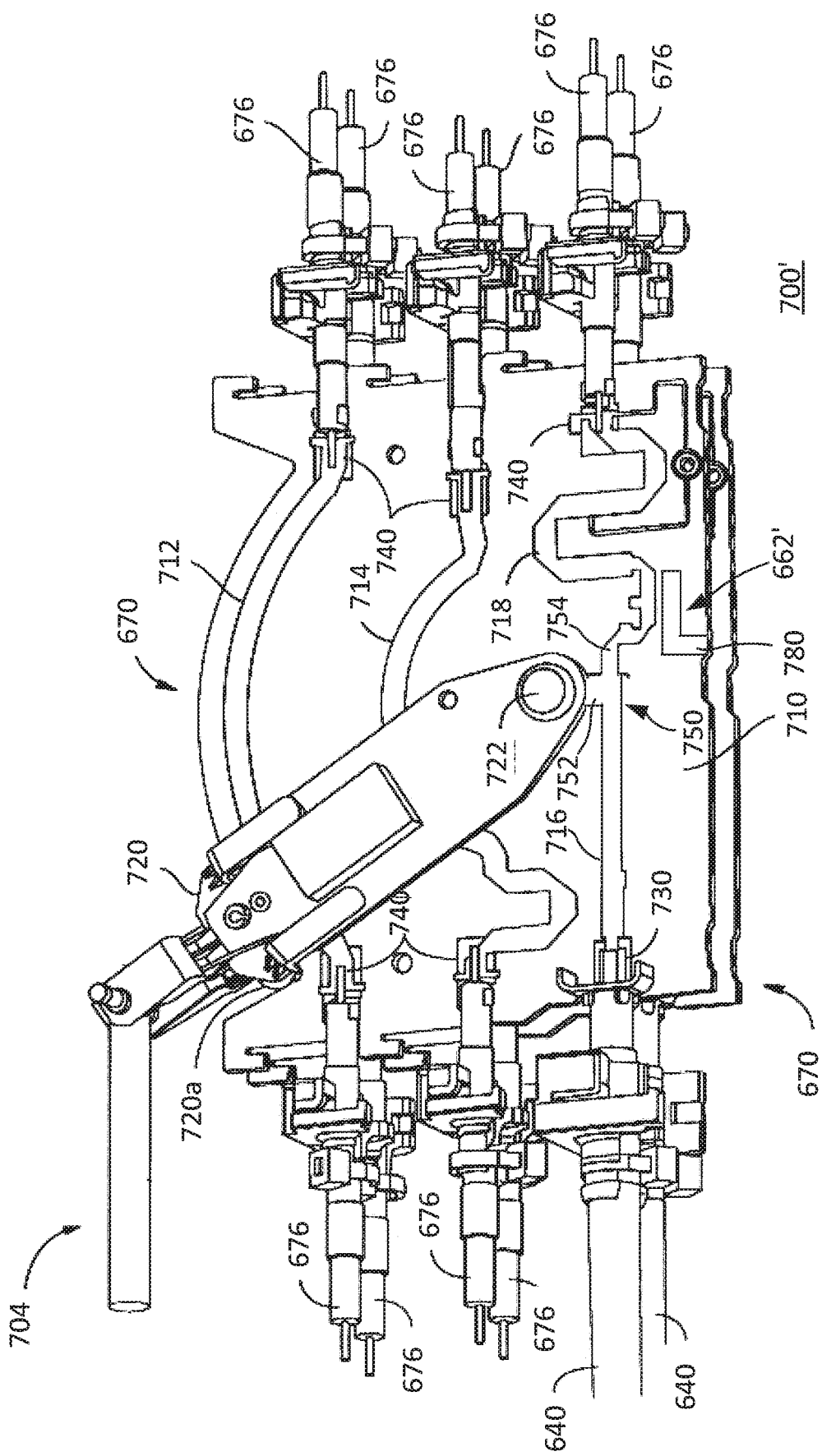
FIG. 12 is a schematic block diagram of a modified version of the phase shifter assembly of FIG. 11 that may be used in the base station antenna of FIG. 10.

FIG. 12 is a perspective view of a phase shifter assembly 700' that is a modified version of the phase shifter assembly 700 of FIG. 11. The phase shifter assembly 700' may be used in place of the phase shifter assembly 700 in base station antennas according to further embodiments of the present invention. As can be seen, the phase shifter assembly 700' may be identical to the phase shifter 700, except that the directional coupler 662' included in base station antenna 700' is formed on transmission line trace 718 instead of transmission line trace 716. This arrangement may be advantageous, because the addition of the directional couplers of the calibration circuit 660 add insertion losses along the RF path. By locating the directional couplers 662' to be after the directional coupler 750, the impact of the insertion loss may be reduced. As noted above, in a typical embodiment only about 20% of the RF energy input to a phase shifter 670 passes to the transmission line trace 718. The directional coupler 662' may then, for example, extract about 5% of the RF energy that is passed to the transmission line trace 718. Thus, since the directional coupler 662' is positioned after the directional coupler 750, the insertion loss of the directional coupler 662' only degrades about 20% of each RF signal, effectively reducing the insertion loss by about 80%. The directional couplers 662' may be formed along the output trace of each phase shifter 670 that is not subject to a variable phase shift (i.e., transmission line trace 718).

While FIGS. 11 and 12 illustrate implementing the calibration couplers on the main printed circuit board of rotary wiper-arc phase shifters, it will be appreciated that portions of the calibration circuit may be implemented on a printed circuit board of any conventional phase shifter including, for example, trombone style sliding dielectric phase shifters, phase shifters that include a plurality of rotary wiper printed circuit boards, etc. Thus, it will be appreciated that the rotary wiper arc phase shifters depicted in FIGS. 11 and 12 are provided simply as examples of possible implementations of the concepts of the present invention on phase shifter circuit boards.

Figure 13:
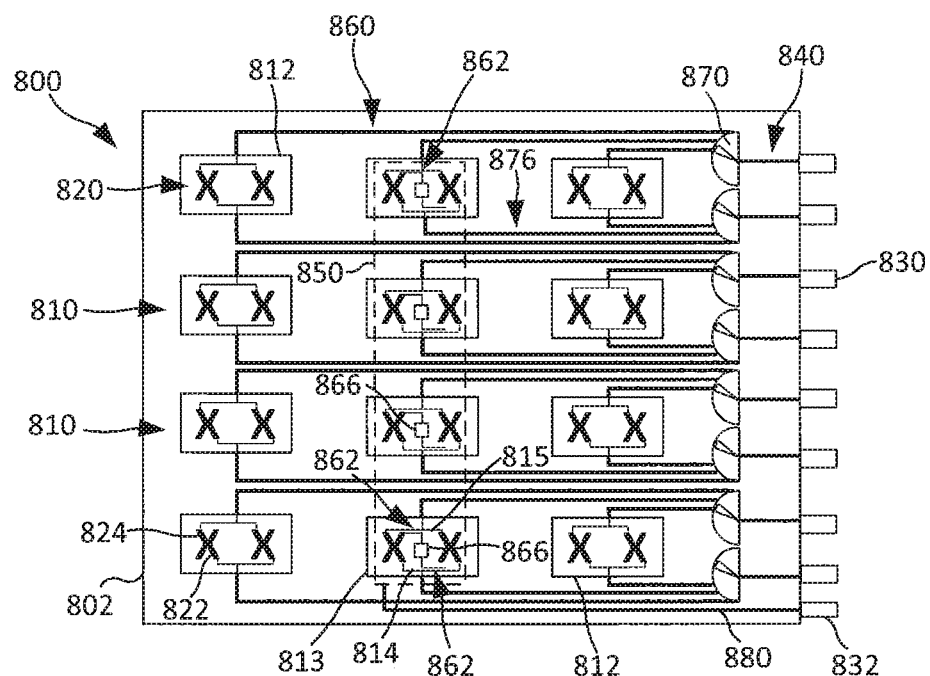
FIG. 13 is schematic block diagram illustrating a base station antenna that includes a modified version of the calibration circuit included in the base station antenna of FIGS. 6-8.

FIG. 13 is schematic view of a base station antenna 800 that includes a modified version of the calibration circuit included in the base station antenna 500 of FIGS. 6-8. The base station antenna 800 combines features of the base station antenna 400 of FIG. 5 and of the base station antenna 500 of FIGS. 6-8. In particular, the base station antenna 800 implements four of the combiners 866 of the calibration combiner on the feed boards 813 as in the base station antenna 400 of FIG. 5, and electromagnetically couples the calibration signals from the feed boards to a calibration circuit board 850 as in the base station antenna 500 of FIGS. 6-8. This arrangement reduces the number of slots required in the reflector 802 and allows for use of a smaller calibration circuit board 850.

As shown in FIG. 13, the base station antenna 800 includes four columns 810 of dual-polarized radiating elements 820 having first and second radiators 822, 824 that are mounted on a backplane 802. The radiating elements 820 may be mounted on feed boards 812 and 813. The base station antenna 800 further includes eight RF ports 830 and a calibration port 832. Input cables 840 connect each of the RF ports 830 to a respective one of a plurality of phase shifters 870, and phase cables 876 connect the outputs of the phase shifters 870 to the feed boards 812, 813. The backplane 802, feed boards 812, radiating elements 820, RF ports 830, calibration port 832, input cables 840 and phase cables 876 may be identical to the backplane 402, feed boards 412, radiating elements 420, RF ports 430, calibration port 432, input cables 440 and phase cables 476 that are discussed above, and hence further description thereof will be omitted here.

Figure 14:
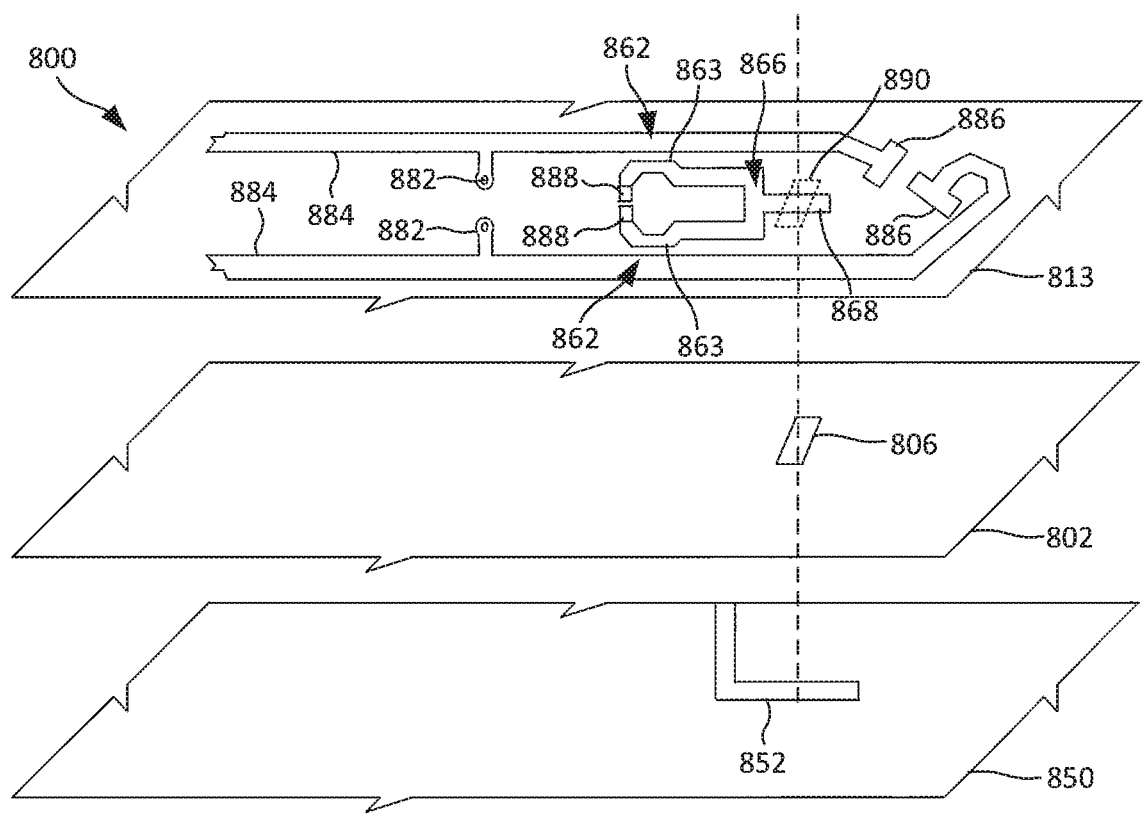
FIG. 14 is a schematic exploded perspective view of a portion of the base station antenna of FIG. 13.

As is further shown in FIG. 13, the base station antenna 800 includes a calibration circuit board 850 that is mounted underneath the four feed boards 813 with the backplane 802 therebetween. The feed boards 813 may be similar to the feed boards 513 of base station antenna 500, except that each feed board 813 may further include a combiner 866 thereon that combines the RF energy tapped by directional couplers 862 from the two RF transmission lines 814, 815. The output of each combiner 866 electromagnetically couples through a respective opening 806 in the backplane 802 to traces (or other structures) on the calibration circuit board 850. FIG. 14 is a schematic exploded perspective view of a portion of the base station antenna of FIG. 13 that further illustrates the design and operation of the calibration circuit 860 that is included in base station antenna 800. In particular, FIG. 14 illustrates a portion of one of the feed boards 813 and the portions of the reflector 802 and the calibration circuit board 850 that are behind the feed board 813.

Referring to FIG. 14, the feed board 813 includes a pair of feed points 882 which each receive a center conductor of respective one of the phase cables 876 (the outer conductor of each phase cable 876 may be soldered to a ground plane formed on the rear side of feed board 813). Each feed point 882 is connected to a respective RF transmission line 884 that connects the feed point 882 to a respective pad 886. The radiating elements 820 are mounted on the pads 886 so that a first of the feed points 886 is electrically connected to the first radiator 822 via the first RF transmission line 884 and the first pad 886, and a second of the feed points 886 is electrically connected to the second radiator 824 via the second RF transmission line 884 and the second pad 886. First and second directional couplers 862 are provided in the form of respective transmission line traces 863 that run parallel to the first and second RF transmission lines 884 that tap RF energy from the respective first and second transmission lines 884. A first end of each RF transmission line trace 863 terminates into a resistor 888 and the second end of each RF transmission line 863 is coupled to an input of a power combiner 866 such as a Wilkinson power combiner. The output 868 of the power combiner 866 is routed over an opening 890 in the ground plane on the rear side of the feed board 813. The backplane 802 has an opening 806 therein that is behind the opening 890 in the ground plane of feed board 813. The calibration circuit board 850 is positioned behind the backplane 802. The calibration circuit board 850 may include a conductive structure 852 such as, for example, a conductive pad that is directly behind the opening 806 in the backplane 802. RF energy that is present at the output 868 of the power combiner 866 may thus electromagnetically couple through the opening 806 in the backplane 802 to the conductive structure 852. The arrangement shown in FIG. 14 is present with respect to each of the four feed boards 813 so that RF energy is coupled onto four separate conductive structures 852 on the calibration circuit board 850. First through third 2×1 directional couplers (not shown) may be provided on the calibration circuit board 850. The four conductive structures 852 on the calibration circuit board 850 may be coupled to the respective inputs of the first and second 2×1 directional couplers, and the outputs of the first and second 2×1 directional couplers may be coupled to the inputs of the third 2×1 directional coupler in order to combine the four calibration signals that are electromagnetically coupled from the four respective feed boards 813 to the conductive structures 852 on the calibration circuit board 850. The output of the third 2×1 directional coupler may be coupled to a fixture that receives the calibration cable 880.

It will be appreciated that the directional couplers of the calibration circuit may also be located on other printed circuit boards included in a base station antenna. For example, some base station antennas include diplexers that are used to combine RF signals travelling along the transmit path so that combined signals may be transmitted through so-called "wideband" radiating elements, and which are used to split received RF signals that are within different frequency bands so that the received signals may be passed to the appropriate receivers. In some case, these diplexers are implemented on printed circuit boards. The directional couplers of the calibration circuit may be implemented on the diplexer printed circuit boards instead of the feed boards or the phase shifter printed circuit boards in other embodiments of the present invention. The diplexers may be located in any conventional position along the RF path, including between the RF ports and the phase shifters or between the phase shifters and the radiating elements. The combiner circuit may be implemented on a separate calibration circuit board, partially on the diplexer printed circuit boards and a calibration circuit board, or on a common printed circuit board that includes the diplexers, the directional couplers of the calibration circuit and the combiners of the calibration circuit.

As another example, some base station antennas are designed to have a fixed downtilt (or no downtilt) as opposed to having a variable downtilt that can be adjusted using electromechanical phase shifters. These fixed tilt antennas often have power divider printed circuit boards that are used to divide an RF signal to be transmitted into a plurality of sub-RF components. These power divider printed circuit boards perform the power dividing function (described above) that is performed by the electromechanical phase shifters included in the base station antennas according to various embodiments of the present invention without performing the variable phase delay. It will be appreciated that the directional couplers could likewise be implemented on the power divider printed circuit boards included in such antennas in the same manner that the directional couplers are implemented on the main printed circuit board of the phase shifters in the base station antennas discussed above with reference to FIGS. 10-12.

Figure 15:
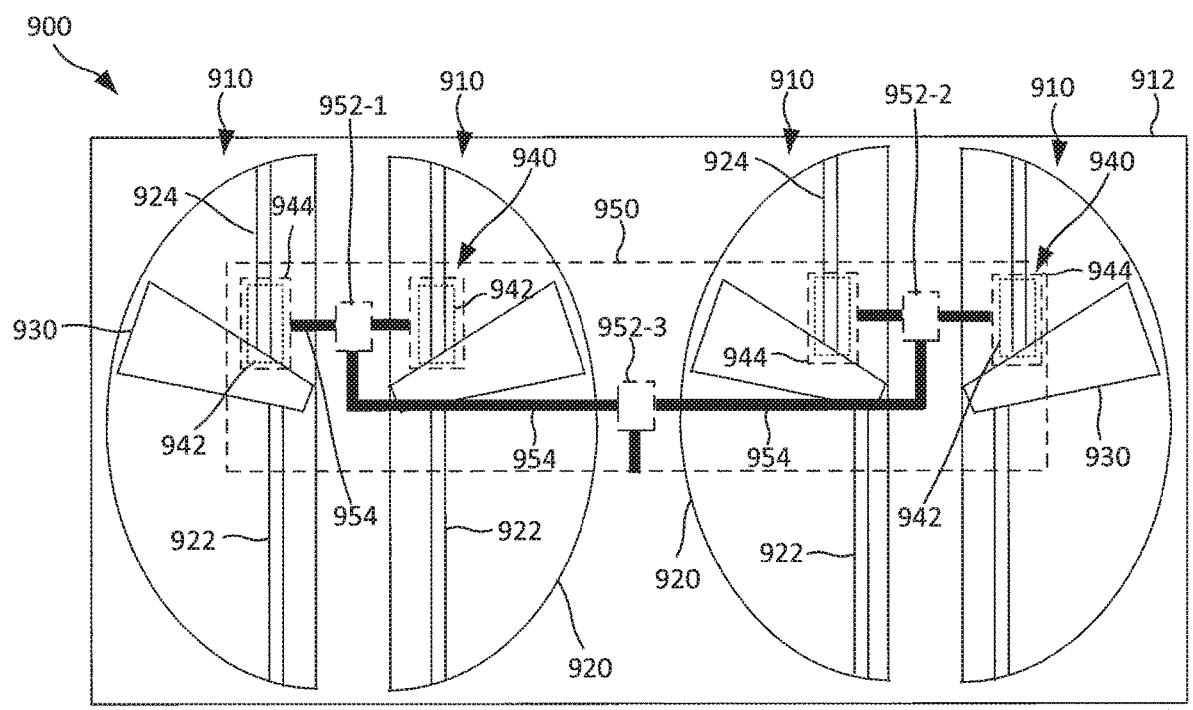
FIG. 15 is a schematic plan illustrating how calibration couplers may be implemented on phase shifter printed circuit boards and electromagnetically coupled to a calibration combiner circuit on a calibration circuit board.

FIG. 15 is a schematic plan view of a portion of a base station antenna 900 that includes four phase shifters 910 that are mounted on a metal support plate 912. FIG. 15 shows how calibration couplers 940 may be formed, for example, on the main printed circuit boards 920 of each phase shifter 910 that electromagnetically extract calibration signals and pass these extracted calibration signals to a calibration circuit board 950 that includes a calibration combiner circuit.

As shown in FIG. 15, each phase shifter 910 may include a main printed circuit board 920 and a wiper printed circuit board 930. Each phase shifter 910 may be identical to one of the phase shifters 670 illustrated in FIG. 12 except in how the calibration coupler is implemented. As shown in FIG. 15, the main printed circuit board 920 of each phase shifter 910 includes an input RF transmission line 922 (which may be identical to the input RF transmission line 716 of phase shifter 670 of FIG. 12) and an output RF transmission line 924 (which may be identical to the output RF transmission line 718 of phase shifter 670 of FIG. 12). A calibration coupler 940 is implemented along the output RF transmission line 924 of each phase shifter 910 using electromagnetic coupling through an opening in a metal plate in a manner similar to that shown in FIG. 14. In particular, as shown in FIG. 15, a calibration coupler 940 may be formed on each phase shifter 910 by forming an opening 942 in the ground plane of each main printed circuit board 920 underneath, for example, the respective output RF transmission lines 924. The calibration circuit board 950 may be mounted underneath the phase shifters 910 and underneath the metal plate 912. Corresponding openings (not separately shown in FIG. 15, but may be identical in location and shape to the respective openings 942) are formed in the metal plate 912 underneath the respective openings 942 in the ground planes of the main printed circuit board 920 of the respective phase shifters 910. Conductive pads 944 may be formed on the calibration circuit board 950 directly beneath the respective openings 914 in the metal plate 912. RF energy that passes along each output transmission line 924 may electromagnetically couple through the respective openings 942 in the ground planes, through the respective openings in the metal plate 912 to the conductive pads 944. In other words, the combination of the openings 942 in the ground plane, the openings in the metal plate 912 and the conductive pads 944 may be used to implement the calibration couplers 940 that couple RF energy from the respective output transmission lines 924 to the conductive pads 944.

As is further shown in FIG. 15, the calibration circuit board 950 may include calibration combiners 952-1 through 952-3. Calibration combiner 952-1 may be coupled by RF transmission lines 954 to a first pair of the conductive pads 944 in order to combine the calibration signals that are coupled to those pad 944, and calibration combiner 952-2 may similarly be coupled by RF transmission lines 954 to a second pair of the conductive pads 944 in order to combine the calibration signals that are coupled to those pad 944. Additional RF transmission lines 954 may be provided on calibration circuit board 950 that are used to couple the outputs of calibration combiners 952-1 and 952-2 to the third calibration combiner 952-3 which outputs a combined calibration signal. Thus, FIG. 15 illustrates how the electromagnetic coupling techniques discussed above with reference to, for example, FIGS. 7-9 and 13-14 may also be used on base station antennas that couple the calibration circuits from the phase shifter printed circuit boards.

In the example embodiments described above, each antenna includes four columns of dual-polarized radiating elements, with two radiating elements provided per feed board (except for feed board 313, which includes eight radiating elements) for a total of six radiating elements per column. It will be appreciated, however, that other numbers of columns and/or radiating elements may be included in antennas according to embodiments of the present invention, and the number of radiating elements per feed board may be varied (e.g., one radiating element or three radiating elements are commonly included on feed boards), and different feed boards may have different numbers of radiating elements. Thus, it will be appreciated that the embodiments described above are exemplary in nature and are not intended to be limiting as to the scope of the present invention, but instead simply illustrate several different, example ways that the calibration circuit may be implemented along the electrical paths connecting the phase shifters to the radiating elements to provide lower cost and/or improved performance antennas.

The present invention has been described above with reference to the accompanying drawings. The invention is not limited to the illustrated embodiments; rather, these embodiments are intended to fully and completely disclose the invention to those skilled in this art. In the drawings, like numbers refer to like elements throughout. Thicknesses and dimensions of some elements may not be to scale.

Spatially relative terms, such as "under", "below", "lower", "over", "upper", "top", "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity. As used herein the expression "and/or" includes any and all combinations of one or more of the associated listed items.

It will be understood that features illustrated with one example embodiment above can be incorporated into any of the other example embodiments. Thus, it will be appreciated that the disclosed embodiments may be combined in any way to provide many additional embodiments.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

That which is claimed is:

1. A base station antenna, comprising:
    a backplane having a front surface and a rear surface;
    a plurality of radiating elements that extend forwardly from the backplane;
    a plurality of feed boards mounted in front of the backplane, each feed board having a respective group of one or more of the plurality of radiating elements mounted thereon; and
    a calibration circuit that includes a plurality of components that are mounted in front of the backplane and at least one additional component that is mounted behind the backplane,
    wherein a first of the feed boards includes a first port of a first directional coupler, and a second port of the first directional coupler is on a rear side of the backplane,
    wherein the at least one additional component comprises at least a portion of a calibration combiner, and
    wherein the calibration combiner is implemented on a circuit board that does not have any radiating elements mounted thereon.

2. The base station antenna of claim 1, wherein the feed boards are arranged in a plurality of columns.

3. The base station antenna of claim 2, wherein the first of the feed boards is in a first of the columns, and a second of the feed boards is in a second of the columns, the second feed board including a first port of a second directional coupler, and a second port of the second directional coupler is on a rear side of the backplane.

4. The base station antenna of claim 3, wherein the second ports of the first and second directional couplers are on a circuit board that includes the calibration combiner.

5. The base station antenna of claim 1, wherein the first directional coupler is configured to couple RF energy through an opening in the backplane.

6. The base station antenna of claim 5, wherein the calibration circuit includes a circuit board that is mounted behind the backplane, and wherein the second port of the first directional coupler comprises a widened trace segment on the circuit board.

7. A base station antenna, comprising:
    a backplane having a front surface and a rear surface;
    a plurality of radiating elements that extend forwardly from the backplane;
    a plurality of feed boards mounted in front of the backplane, each feed board having a respective group of one or more of the plurality of radiating elements mounted thereon; and
    a calibration circuit that includes a plurality of components that are mounted in front of the backplane and at least one additional component that is mounted behind the backplane,
    wherein the calibration circuit includes a calibration circuit board that is mounted behind the backplane,
    wherein the calibration circuit includes a directional coupler that has a first port that is on a first of the feed boards and a second port that is on the calibration circuit board, and
    wherein the calibration circuit board does not have any radiating elements mounted thereon.

8. The base station antenna of claim 7, wherein the directional coupler is configured to couple RF energy through an opening in the backplane.

9. The base station antenna of claim 7, wherein the directional coupler comprises a first trace on the first of the feed boards, the first trace overlapping an opening in the backplane along an axis perpendicular to a plane defined by the backplane.

10. The base station antenna of claim 9, wherein the first trace is on a rear side of a dielectric layer of the first of the feed boards, the first of the feed boards further including additional traces on a front side of the dielectric layer.

11. The base station antenna of claim 10, wherein the calibration circuit includes a widened trace that overlaps the opening along the axis perpendicular to the plane defined by the backplane.

12. A base station antenna, comprising:
a backplane;
a plurality of radiating elements that are arranged in a plurality of rows and columns, the plurality of radiating elements including at least a first radiating element and a second radiating element, each of the radiating elements extending forwardly from the backplane;
a plurality of separate feed boards mounted in front of the backplane, each feed board having a respective group of one or more of the plurality of radiating elements mounted thereon, wherein multiple feed boards are included in each column and at least some of the rows;
a calibration port; and
a calibration circuit that comprises:
 a calibration combiner that has an output that is coupled to the calibration port; and
 a plurality of directional couplers that are coupled to the calibration combiner,
wherein each directional coupler is implemented on a respective one of a subset of the feed boards, and
wherein the calibration combiner is implemented on a calibration combiner printed circuit board that does not have any radiating elements mounted thereon.

13. The base station antenna of claim 12, wherein the calibration combiner printed circuit board is positioned behind the backplane.

14. The base station antenna of claim 12, wherein the subset of the feed boards includes the same number of feed boards as there are columns of radiating elements.

15. The base station antenna of claim 14, wherein the subset of the feed boards includes one feed board in each column of radiating elements.

16. The base station antenna of claim 12, wherein the calibration combiner is coupled to each feed board in the subset of the feed boards by a respective cabling connection.

17. The base station antenna of claim 12, further comprising a plurality of phase shifters, wherein an output of each phase shifter that is not subject to an adjustable phase shift is coupled to respective feed boards in the subset of the feed boards.

* * * * *

UNITED STATES PATENT AND TRADEMARK OFFICE
CERTIFICATE OF CORRECTION

PATENT NO. : 11,411,661 B2
APPLICATION NO. : 17/036265
DATED : August 9, 2022
INVENTOR(S) : Li et al.

Page 1 of 1

It is certified that error appears in the above-identified patent and that said Letters Patent is hereby corrected as shown below:

On the Title Page

(62) Related U.S. Application Data: Please correct "Apr. 25, 2019" to read --Apr. 25, 2020--

Signed and Sealed this
Twenty-second Day of November, 2022

*Katherine Kelly Vidal*

Katherine Kelly Vidal
*Director of the United States Patent and Trademark Office*